United States Patent
Schweitzer, III et al.

(10) Patent No.: US 10,742,022 B2
(45) Date of Patent: **\*Aug. 11, 2020**

(54) FAULT DETECTION IN ELECTRIC POWER DELIVERY SYSTEMS USING UNDERREACH, DIRECTIONAL, AND TRAVELING WAVE ELEMENTS

(71) Applicant: Schweitzer Engineering Laboratories, Inc., Pullman, WA (US)

(72) Inventors: Edmund O. Schweitzer, III, Pullman, WA (US); Mangapathirao Venkata Mynam, Pullman, WA (US); Armando Guzman-Casillas, Pullman, WA (US); Bogdan Z. Kasztenny, Markham (CA); Veselin Skendzic, Schwenksville, PA (US); David E. Whitehead, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 765 days.

This patent is subject to a terminal disclaimer.

(21) Appl. No.: 15/422,965

(22) Filed: Feb. 2, 2017

(65) Prior Publication Data
US 2017/0146613 A1 May 25, 2017

Related U.S. Application Data

(63) Continuation of application No. 14/856,353, filed on Sep. 16, 2015, now Pat. No. 9,594,112.
(Continued)

(51) Int. Cl.
*H02H 3/00* (2006.01)
*H02H 7/20* (2006.01)
(Continued)

(52) U.S. Cl.
CPC ............... *H02H 7/20* (2013.01); *G01R 31/08* (2013.01); *G01R 31/085* (2013.01);
(Continued)

(58) Field of Classification Search
CPC .... G01R 31/40; G01R 31/08; G01R 31/2836; H02H 7/20; H02H 7/28; H02H 7/265
(Continued)

(56) References Cited

U.S. PATENT DOCUMENTS

| | | | |
|---|---|---|---|
| 3,585,298 | A | 6/1971 | Liberman |
| 3,670,240 | A | 6/1972 | Maranchak |

(Continued)

FOREIGN PATENT DOCUMENTS

| | | |
|---|---|---|
| EP | 226210 | 12/1986 |
| EP | 241832 | 7/1990 |

(Continued)

OTHER PUBLICATIONS

Harshad Mehta, Fault Location Techniques for High-Voltage DC Lines, EPRI EL-4331 Project 2150-1, 1985.
(Continued)

*Primary Examiner* — Thienvu V Tran
*Assistant Examiner* — Lucy M Thomas
(74) *Attorney, Agent, or Firm* — Jared L. Cherry; Richard M. Edge

(57) ABSTRACT

The present disclosure pertains to systems and methods for detecting faults in an electric power delivery system. In one embodiment, system may include a data acquisition subsystem configured to receive a plurality of representations of electrical conditions. The system may also include an incremental quantities subsystem configured to calculate an incremental current quantity and an incremental voltage quantity based on the plurality of representations. A fault detection subsystem may be configured to determine a fault
(Continued)

type based on the incremental current quantity and the incremental voltage quantity, to select an applicable loop quantity, and to declare a fault based on the applicable loop quantity, the incremental voltage quantity, and the incremental current quantity. A protective action subsystem may implement a protective action based on the declaration of the fault.

19 Claims, 17 Drawing Sheets

Related U.S. Application Data

(60) Provisional application No. 62/051,193, filed on Sep. 16, 2014.

(51) Int. Cl.
  *G01R 31/28* (2006.01)
  *G01R 31/08* (2020.01)
  *G05B 9/02* (2006.01)
  *H02H 7/26* (2006.01)
  *H02H 3/04* (2006.01)
  *G01R 31/40* (2020.01)

(52) U.S. Cl.
  CPC ....... *G01R 31/088* (2013.01); *G01R 31/2836* (2013.01); *G01R 31/40* (2013.01); *G05B 9/02* (2013.01); *H02H 3/042* (2013.01); *H02H 7/265* (2013.01)

(58) Field of Classification Search
  USPC ..................................................... 361/79, 80
  See application file for complete search history.

(56) References Cited

U.S. PATENT DOCUMENTS

| | | | |
|---|---|---|---|
| 3,878,460 A | 4/1975 | Nimmersjö | |
| 3,890,544 A | 6/1975 | Chamia | |
| 3,956,671 A | 5/1976 | Nimmersjö | |
| 4,053,816 A | 10/1977 | Nimmersjö | |
| 4,254,444 A | 3/1981 | Erikson | |
| 4,296,452 A | 10/1981 | Eriksson | |
| 4,344,142 A | 8/1982 | Diehr | |
| 4,351,011 A | 9/1982 | Liberman | |
| 4,377,834 A | 3/1983 | Eriksson | |
| 4,499,417 A | 2/1985 | Wright | |
| 4,626,772 A | 12/1986 | Michel | |
| 4,731,689 A * | 3/1988 | Nimmersjo et al. ..... | H02H 7/26 361/66 |
| 4,766,549 A | 8/1988 | Schweitzer | |
| 4,797,805 A | 1/1989 | Nimmersjö | |
| 4,800,509 A | 1/1989 | Nimmersjö | |
| 5,198,746 A | 3/1993 | Gyugyi | |
| 5,446,387 A | 8/1995 | Eriksson | |
| 5,572,138 A | 11/1996 | Nimmersjö | |
| 5,682,100 A | 10/1997 | Rossi | |
| 5,729,144 A | 3/1998 | Cummins | |
| 6,341,055 B1 | 1/2002 | Guzman-Casillas | |
| 6,417,791 B1 | 7/2002 | Benmouyal | |
| 6,477,475 B1 | 11/2002 | Takaoka | |
| 6,597,180 B1 | 7/2003 | Takaoka | |
| 6,798,211 B1 | 9/2004 | Rockwell | |
| 7,174,261 B2 | 2/2007 | Gunn | |
| 7,535,233 B2 | 5/2009 | Kojovic | |
| 7,714,735 B2 | 5/2010 | Rockwell | |
| 7,733,094 B2 | 6/2010 | Bright | |
| 8,315,827 B2 | 11/2012 | Faybisovich | |
| 8,525,522 B2 | 9/2013 | Gong | |
| 8,598,887 B2 | 12/2013 | Bjorklund | |
| 8,655,609 B2 | 2/2014 | Schweitzer | |
| 8,781,766 B2 | 7/2014 | Schweitzer | |
| 8,990,036 B1 | 3/2015 | Schweitzer | |
| 9,470,748 B2 | 10/2016 | Schweitzer | |
| 9,594,112 B2 | 3/2017 | Schweitzer | |
| 9,627,881 B2 | 4/2017 | Schweitzer | |
| 2001/0012984 A1 | 8/2001 | Adamiak | |
| 2002/0165462 A1 | 11/2002 | Westbrook | |
| 2004/0189317 A1 | 9/2004 | Borchert | |
| 2004/0230387 A1 | 11/2004 | Bechhoefer | |
| 2005/0151659 A1 | 7/2005 | Donovan | |
| 2006/0012374 A1 | 1/2006 | Kojovic | |
| 2008/0077336 A1 | 3/2008 | Fernandes | |
| 2009/0230974 A1 | 9/2009 | Kojovic | |
| 2011/0058285 A1 | 3/2011 | Wibben | |
| 2011/0173496 A1 | 7/2011 | Hosek | |
| 2011/0264388 A1 | 10/2011 | Gong | |
| 2012/0086459 A1 | 4/2012 | Kim | |
| 2013/0021039 A1 | 1/2013 | Bjorklund | |
| 2013/0096854 A1 | 4/2013 | Schweitzer | |
| 2013/0100564 A1 | 4/2013 | Zhang | |
| 2013/0241622 A1 | 9/2013 | Zerbe | |
| 2014/0074414 A1 | 3/2014 | Schweitzer, III | |
| 2016/0077149 A1 | 3/2016 | Schweitzer | |
| 2016/0077150 A1 | 3/2016 | Schweitzer | |
| 2016/0084893 A1 | 3/2016 | Schweitzer | |
| 2017/0012424 A1 | 1/2017 | Schweitzer | |
| 2017/0082675 A1 | 3/2017 | Schweizer | |
| 2017/0146613 A1 | 5/2017 | Schweitzer | |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

PCT/US2012/060089 Patent Cooperation Treaty, International Search Report and Written Opinion of the International Searching Authority, dated Feb. 5, 2013.

Elhaffar, Power Transmission Line Fault Location Based on Current Traveling Waves. TKK Dissertations 107, Espoo 2008, Helsinki University of Technology. Department of Electrical Engineering, Dec. 2008.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Americo Pinto Moutinho, Fault Location by Traveling Waves: Application in High Impedance Events.

N. Fischer, V. Skendzic, R. Moxley, J. Needs, Protective Relay Traveling Wave Fault Location, Feb. 9, 2012.

(56) References Cited

OTHER PUBLICATIONS

PCT/US2014/055894 Patent Cooperation Treaty, International Search Report and Written Opinion of the International Searching Authority, dated Dec. 17, 2014.

PCT/US2014/055896 Patent Cooperation Treaty, International Search Report and Written Opinion of the International Searching Authority, dated Dec. 18, 2014.

PCT/US2014/055919 Patent Cooperation Treaty, International Search Report and Written Opinion of the International Searching Authority, dated Dec. 22, 2014.

Borghetti, et al, "On the use of continuous-wavelet transform for fault location in distribution power systems." International Journal of Electrical Power & Energy Systems. Nov. 2006.

Maher M.I. Hashim, Hew Wooi Ping, V.K. Ramachandaramurthy, Impedance-Based Fault Location Techniques for Transmission Lines, Sep. 2009.

Zheng et al., Study on Impedance-Traveling Wave Assembled Algorithm in One-Terminal Fault Location System for Transmission Lines, Apr. 2008.

Gabriel Benmouyal, Karl Zimmerman, Experience With Subcycle Operating Time Distance Elements in Transmission Line Digital Relays, Presented at the 37th Annual Western Protective Relay Conference Oct. 2010.

Edmund O. Schweitzer, III, Armando Guzman-Casillas, Mangapathirao Venkat Mynam, Veselin Skendzic, Bogdan Kasztenny, Stephen Marx, Locating Faults by the Traveling Waves They Launch, Feb. 10, 2014.

Toshio Tahagi, Jun-Ichi Baba, Katauhiko Usmura, Tishiaki Sakaguchi, Fault Protection Based on Travelling Wave Theory—Part I Theory, Jan. 24, 1977.

PCT/US2015/050504 Patent Cooperation Treaty, International Search Report and Written Opinion of the International Searching Authority, dated Jan. 29, 2016.

He, Baina, Yunwei Zhao, and Hengxu Ha. "A Novel Wave Based Differential Protection for Distributed Parameter Line." TELKOMNIKA Indonesian Journal of Electrical Engineering TELKOMNIKA 11.9 (2013): 5097-104.

Tang, Lanxi; Dong, Xinzhou; Shi, Shenxing; Wang, Bin; "Travelling Wave Differential Protection Based on Equivalent Travelling Wave", 13th IET International Conference on Developments in Power System Protection (DPSP 2016), Mar. 7-10, 2016.

PCT/US2016/052329 Patent Cooperation Treaty, International Search Report and Written Opinion of the International Searching Authority, dated Jan. 6, 2017.

PCT/US2017/037345 Patent Cooperation Treaty, International Search Report and Written Opinion of the International Searching Authority, dated Aug. 24, 2017.

PCT/US2017/037288 Patent Cooperation Treaty, International Search Report and Written Opinion of the International Searching Authority, dated Aug. 28, 2017.

* cited by examiner

FAULT DETECTION IN ELECTRIC POWER DELIVERY SYSTEMS USING UNDERREACH, DIRECTIONAL, AND TRAVELING WAVE ELEMENTS

RELATED APPLICATION

The present application is a continuation application of U.S. patent application Ser. No. 14/856,353, filed on 16 Sep. 2015 titled "Fault Detection in Electric Power Delivery Systems Using Underreach, Directional, and Traveling Wave Elements", naming Edmund O. Schweitzer III, Mangapathirao Venkata Mynam, Armando Guzman-Casillas, Bogdan Z. Kasztenny, Veselin Skendzic, and David E. Whitehead as inventors; which application claims priority under 35 U.S.C. § 119(e) to U.S. Provisional Patent Application No. 62/051,193, filed Sep. 16, 2014, and titled "Fault Detection in Electric Power Delivery Systems Using Underreach, Directional, and Traveling Wave Elements," both of which are incorporated herein by reference in their entireties.

TECHNICAL FIELD

This disclosure relates to detecting and locating faults in electric power delivery systems. More particularly, this disclosure relates to using time domain elements and analysis to determine fault location in electric power delivery systems. In various embodiments, systems and methods consistent with the present disclosure may utilize underreach/overreach, directional, and/or traveling wave elements.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
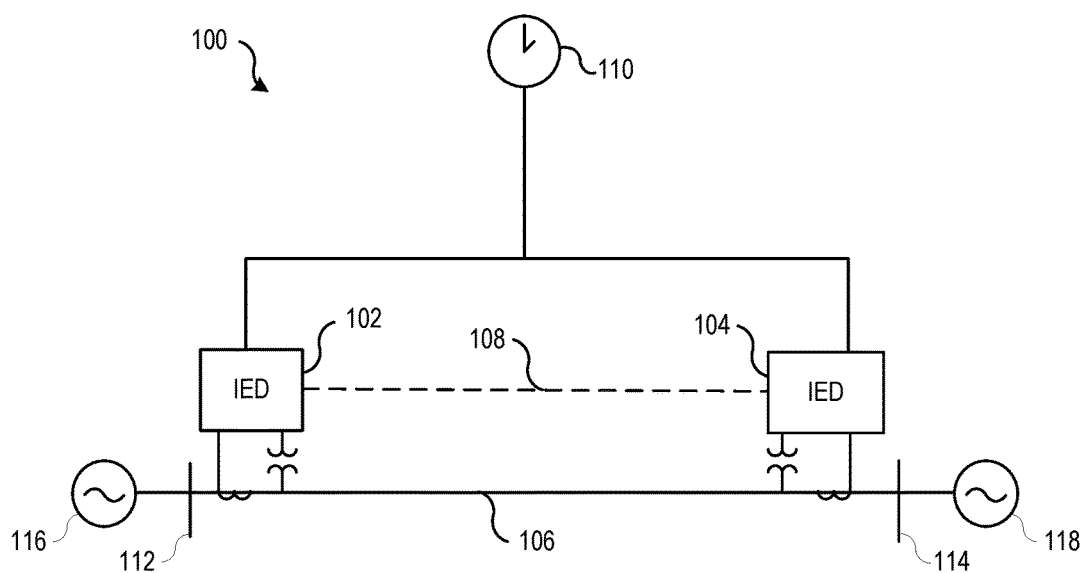
FIG. 1 illustrates a block diagram of a system for detecting a traveling wave and calculating a location of a fault using the detected traveling wave consistent with certain embodiments of the present disclosure.

Faster transmission line protection improves power system stability. If faults are not cleared before the critical fault clearing time, the system may lose transient stability and possibly suffer a black out. In addition, faster fault clearing increases the amount of power that can be transferred. Faster protection also enhances public and utility personnel safety, limits equipment wear, improves power quality, and reduces property damage.

Most protection principles are based on the fundamental frequency components of voltages and currents. Accurate measurement of a sinusoidal quantity typically takes a cycle. To increase the speed of protection actions, an analysis of transient components may be undertaken in connection with various embodiments of the present disclosure. Further, information relating to electrical conditions may be communicated among devices to provide end-to-end transmission line protection.

Primary protective relaying systems typically operate in one to one-and-a-half cycles, and the breakers interrupt current in one-and-a-half to three cycles, so faults are typically cleared in three to four cycles. Sometimes the relaying system operates faster. For example, sensitive instantaneous overcurrent elements can be used for switch-onto-fault events, and may have an operation time as low as one-quarter of a cycle. Traditional frequency domain techniques obtained by extracting fundamental frequency components (phasors) may be applied to identify a fault after transient signals fade. The filtering necessary for phasor measurement results in operating times of about one power cycle, with the best-case times approaching half a cycle for close-in high-current faults.

However, for purposes of determining stability limits for planning purposes, it is most appropriate to utilize conservative protection operating times. If a breaker fails to trip, breaker failure schemes take over, and fault clearing is delayed until the slowest backup breaker operates, which may be around 10 to 12 cycles. If time-coordinated remote backup protection is used instead of breaker failure protection, the fault clearing time may be as high as a few hundred milliseconds.

High-speed protection devices respond to high-frequency signal components, which may be used to detect faults and to realize various advantages. For example, certain nontraditional energy, such as wind and solar, are connected to the power system through a power electronics interface. As such, these sources typically have little or no inertia. Their control algorithms protect the converters for network fault conditions. As a result, these sources produce voltages and currents that challenge some protection principles developed for networks with synchronous generators. In contrast, high-speed protection devices configured to respond to high-frequency signal components are less dependent on the sources and more dependent on the network itself. As a result, such relays may be useful in applications near nontraditional sources.

Various embodiments consistent with the present disclosure may analyze traveling waves (TWs) to aid in the detection of faults. When a fault occurs in an electric power system, traveling waves are launched from the fault and travel outward at a velocity near the speed of light. The traveling waves are reflected by buses and other discontinuities according to their corresponding characteristic impedances. In the initial stage of the fault, the electric power system may behave like a distributed parameter network. Accordingly, the traveling waves may be described by the propagation velocity, the reflection and transmission coefficients, and the line characteristic impedance. Using a traveling wave detection algorithm, a high-speed relay may be able to detect a fault and initiate corrective action in less than 1 millisecond consistent with certain embodiments of the present disclosure.

After a few roundtrip reflections, traveling waves from a fault recombine into stationary waves, and the power system may be approximated using a lumped parameter RLC network in a transient state. Given the speed of traveling waves, such a condition may be realized very shortly following the occurrence of a fault. TWs from a fault anywhere on a 100-mile line reach both ends within 600 microseconds. Various embodiments consistent with the present disclosure may analyze the "lumped circuit theory" transient waveforms to detect a fault and initiate corrective action within milliseconds consistent with certain embodiments of the present disclosure.

Various techniques may be used to simplify models utilized in certain embodiments. For example, certain embodiments may analyze incremental quantities, which are signals that appear due to a fault and do not contain load voltages or currents. Incremental quantities may simplify the line and system representation by eliminating power sources and leaving the fault as the only "source" in the equivalent network. In other words, the driving force of the transient is the fault, and the driving force of the steady-state response is the set of system fundamental frequency sources (e.g., generators).

Ultra-high-speed principles allow relays to identify events that are located within the protected zone but are not necessarily permanent faults. Incipient cable failures or surge arrester conduction events may present detection challenges to existing feeder and bus relays, respectively. Similarly, the ultra-high-speed line protection needs to ensure that an in-zone event is a legitimate fault.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be illustrated as software modules or components. In other embodiments, hardware-implemented embodiments may be used. Such embodiments may utilize, among other technologies, field-programmable gate arrays. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

FIG. 1 illustrates a block diagram of a system 100 for detecting and calculating a location of a fault using time-domain principles and elements further described herein. System 100 may include generation, transmission, distribution and/or similar systems. System 100 includes a conductor 106 such as a transmission line connecting two nodes, which are illustrated as a local terminal 112 and a remote terminal 114. Local and remote terminals 112 and 114 may be buses in a transmission system supplied by generators 116 and 118, respectively. Although illustrated in single-line form for purposes of simplicity, system 100 may be a multi-phase system, such as a three-phase electric power delivery system.

System 100 is monitored by IEDs 102 and 104 at two locations of the system, although further IEDs may also be utilized to monitor further locations of the system. As used herein, an IED (such as IEDs 102 and 104) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. IEDs 102 and 104 may obtain electric power system information using current transformers (CTs), potential transformers (PTs), Rogowski coils, voltage dividers and/or the like. IEDs 102, 104 may be capable of using inputs from conventional instrument transformers such as CTs and PTs conventionally used in monitoring of electric power delivery. IEDs 102 and 104 may also receive common time information from a common time source 110.

Common time source 110 may be any time source capable of delivering a common time signal to each of IEDs 102 and 104. Some examples of a common time source include a Global Navigational Satellite System (GNSS) such as the Global Positioning System (GPS) delivering a time signal corresponding with IRIG, a WWVB or WWV system, a network-based system such as corresponding with IEEE 1588 precision time protocol, and/or the like. According to one embodiment, common time source 110 may comprise a satellite-synchronized clock (e.g., Model No. SEL-2407, available from SEL). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

A data communication channel 108 may allow IEDs 102 and 104 to exchange information relating to, among other things, voltages, currents. time-domain fault detection and location. According to some embodiments, a time signal based on common time source 110 may be distributed to and/or between IEDs 102 and 104 using data communication channel 108. Data communication channel 108 may be embodied in a variety of media and may utilize a variety of communication protocols. For example, data communication channel 108 may be embodied utilizing physical media, such as coaxial cable, twisted pair, fiber optic, etc. Further, data communication channel 108 may utilize communication protocols such as Ethernet, SONET, SDH, or the like, in order to communicate data.

In several embodiments herein, traveling waves on the electric power delivery system may be used to detect and calculate location of a fault. Two-end fault locating methods, which may be referred to herein as Type D methods, may use a time difference between a traveling wave captured at both terminals along with the line length and wave propagation velocity to compute the fault location. Measurement devices at the line terminals detect the traveling waves and time stamp the arrival of the wave using a common time reference (e.g., IRIG-B or IEEE 1588). In certain embodiments, a distance to a fault location (m) is calculated using Eq. 1.

$$m = \frac{1}{2}[L + (t_L - t_R) \cdot v] \qquad \text{Eq. 1}$$

where: $t_L$ is the front wave arrival time at the L Terminal,
$t_R$ is the front wave arrival time at the R Terminal,
v is the wave propagation speed,
L is the line length.

Traditionally these solutions use a master station that accesses the wave arrival times and estimates the fault location. Recently, line relays equipped with traveling wave fault locating function may exchange the wave arrival times, calculate the fault location, and make the fault location available at the relay. One of the key benefits of using the Type D method is its simplicity and immunity to reflections.

Figure 2A:
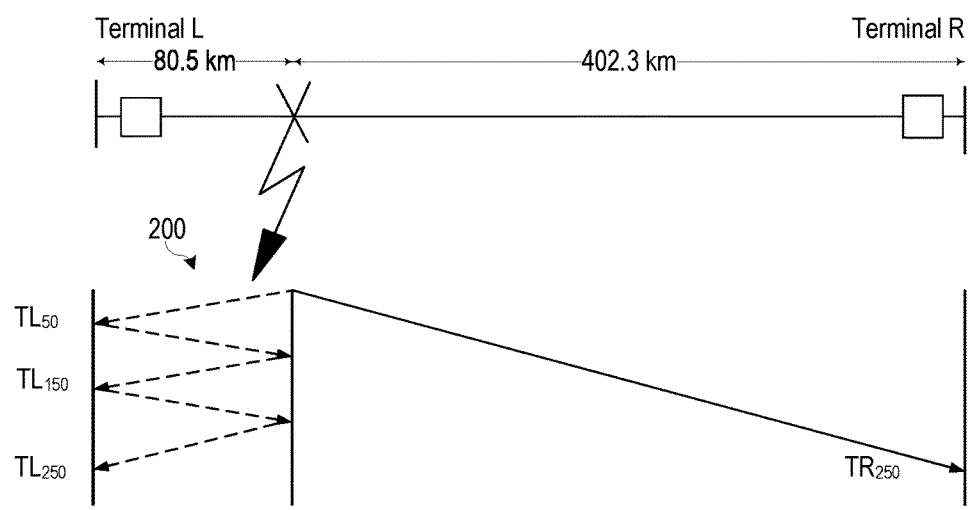
FIG. 2A illustrates a lattice diagram showing incident and reflected traveling waves over a relative time scale created by a fault event on a 300 mile (482.8 km) long transmission line consistent with certain embodiments of the present disclosure.

FIG. 2A illustrates a lattice diagram 200 showing incident and reflected traveling waves created by a fault consistent with certain embodiments of the present disclosure. In the illustrated embodiment, a fault is located 50 miles (80.5 km) from a first terminal on a 300 mile (482.8 km) long line. The incident wave triggered by the fault reaches the Terminal L at time $TL_{50}$, and reaches the Terminal R at time $TR_{250}$. The Type D method may use the $TL_{50}$ and $TR_{250}$ to compute the fault location while ignoring all the other waves. When desired, remaining wave arrivals can be used to improve the initial fault location estimate.

Figure 2B:
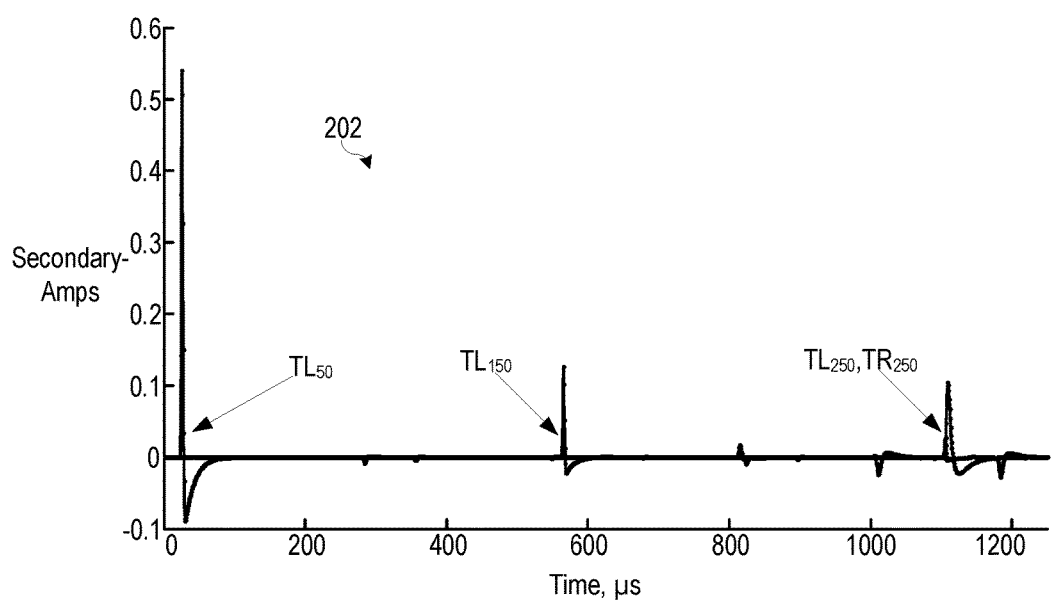
FIG. 2B illustrates the incident and reflected traveling waves as a function of current over time from the fault illustrated in FIG. 2A consistent with certain embodiments of the present disclosure.

FIG. 2B illustrates the incident and reflected traveling waves as a function of current over time 202 from the fault illustrated in FIG. 2A consistent with certain embodiments of the present disclosure. As illustrated, the magnitude of the reflected traveling waves diminishes with each reflection. Time alignment of data samples received at both Terminal L and Terminal R allows for comparison of the incident and reflected waves from both terminals.

A single-end fault locating method, which is also referred to herein as a Type A fault locating method, uses the time difference between the first arrived traveling wave and a subsequent reflection from the fault or the remote terminal. The Type A method is not dependent on a communication channel to the remote terminal. However, the challenge is to identify and select the appropriate reflection. The Type A method may be useful, according to some embodiments, when the fault location is computed during reclosing events on a permanent fault when one of the terminals is open.

FIG. 2B illustrates the reflections from the fault at terminal L. The polarity, amplitude, and arrival time of the reflected waves can be used to identify the reflected wave from the fault or the remote terminal and calculate the fault location. At the L Terminal, the Type A method may use points labeled $TL_{50}$ and $TL_{150}$ in FIG. 2B to compute the fault location while ignoring other waves and reflections. In certain embodiments, a distance to a fault location (m) may be calculated using the Type A method using Equation 2.

$$m = \left(\frac{t_{L2} - t_{L1}}{2}\right) \cdot v \qquad \text{Eq. 2}$$

where: $t_{L2}$ is the arrival time of the first reflection from the fault at the L Terminal;

$t_{L1}$ is the arrival time of the initial wave front from the fault at the L Terminal;

and v is the wave propagation speed.

In various embodiments, the polarity of the traveling wave may be used to determine the direction to the fault. Voltage and current polarities are opposite if the fault is in the forward direction. If the fault is in the reverse direction, the voltage and current traveling waves have same polarity.

Figure 2C:
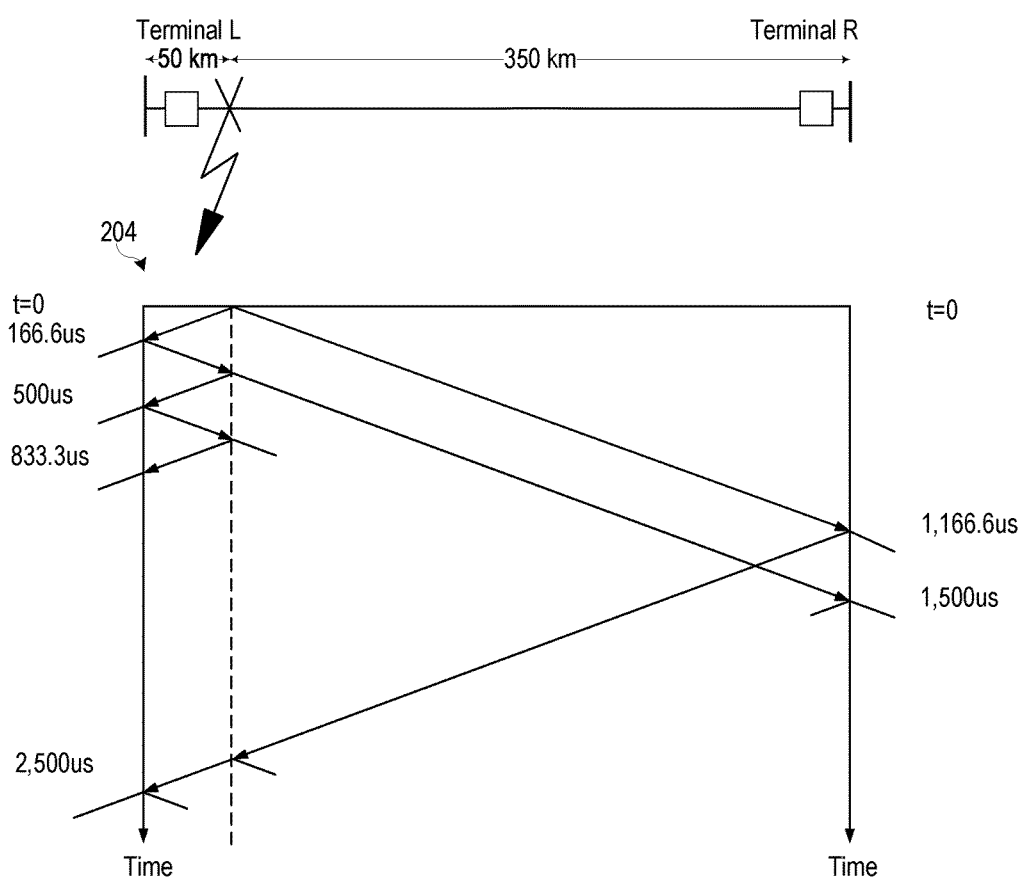
FIG. 2C illustrates a lattice diagram showing the incident and reflected traveling waves at a remote terminal and a local terminal from a fault event on a 400 km long transmission line consistent with certain embodiments of the present disclosure.

FIG. 2C illustrates a lattice diagram 204 showing the incident and reflected traveling waves at a remote terminal and a local terminal from a fault event on a 400 km long transmission line consistent with certain embodiments of the present disclosure. Assuming a $3 \times 10^8$ m/s propagation velocity, a fault located at 50 km on a 400 km line would result in a time lag between the initial front-wave and the first legitimate reflection from the fault that may be calculated using Eq. 3.

$$\frac{2 \times 50 \times 10^3}{3 \times 10^8} = 333 \text{ μs} \qquad \text{Eq. 3}$$

Further, knowing that the line is 400 km long, it is possible to obtain a delay time estimate for the first wave reflected from the remote terminal. With respect to the instant of fault occurrence, the first reflection from the remote terminal will be per Eq. 4.

$$\frac{(2*400 - 50)*10^3}{3*10^8} = 2{,}500 \text{ μs} \qquad \text{Eq. 4}$$

As illustrated in FIG. 2C, a local relay generates measurement with respect to the first arriving wave, which is 166.6 μs, because of the 50 km distance between the local relay and the fault. The estimate determined using Eq. 4 may provide a window in which a reflected wave may be expected after the initial front wave.

While the previous two-ended and single-ended traveling wave fault location methods provided a more accurate estimate of the location of the fault than was available using, for example, impedance-based methods, these methods were constrained due to communication system limitations and reliance on frequency-domain measurements. In the frequency domain, measurements of electric power system voltage and current require a full electric power system cycle to calculate with adequate accuracy. Thus, previous fault detection and location algorithms could not determine a location of a fault faster than one electric power system cycle, for most faults.

The time-domain electric power system fault detection and location techniques described herein do not require a complete electric power system cycle to calculate measurements of voltage or current. Conventional PTs and CTs may be used to provide signals corresponding to the voltage and current of the electric power delivery system, which may be used for fault detection and location calculations in less than one electric power system cycle.

Figure 3:
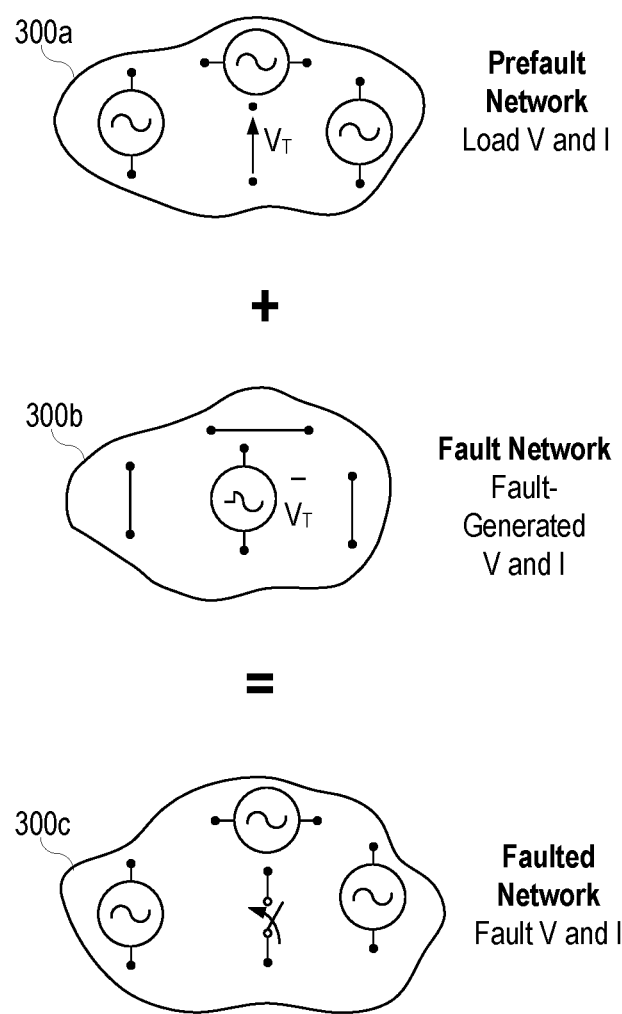
FIG. 3 illustrates a conceptual representation of a faulted electrical network as an equivalent of the sum of a pre-fault network and a fault network consistent with certain embodiments of the present disclosure

FIG. 3 illustrates a conceptual representation of a faulted electrical network 300c as an equivalent of the sum of a pre-fault network 300a and a fault network 300b consistent with certain embodiments of the present disclosure. Thus, the faulted network 300c may be solved by analyzing separately the pre-fault network 300a with the load portion of the currents and voltage and the faulted network 300c to obtain the fault generated components of the currents and voltages. The actual solution of currents and voltages at any point in the faulted network are calculated as sums of the pre-fault and fault-generated components.

The pre-fault network 300a may be in steady state. The fault network 300b has only one source (the Thévenin's source) and an equivalent impedance. The Thévenin's source voltage is the voltage at the fault point in the pre-fault network. Before the fault, the fault network 300b is not energized and all of its voltages and currents are zero. When a fault occurs, the fault network 300b goes through a transient state and eventually settles into the fault steady state. The fault network 300b can be solved for the steady-state values or for the transient values. The incremental quantities are valid for both states. By their nature, the fault-generated signal components are not affected by load, but are driven by a single source in the fault network located at the fault point. As a result, these quantities depend mostly on the network parameters.

The fault signals in the fault network 300b may be measured directly by monitoring the instantaneous voltages and currents during the fault. Because the fault signals are sums of the pre-fault signals and the fault-generated signals, the fault-generated signals in fault network 300b are the difference between the fault signals in faulted network 300c and the pre-fault signals in pre-fault network 300a. The pre-fault signals in pre-fault network 300a may be measured prior to the fault and extrapolated beyond the fault. This extrapolation is valid only for a period of few tens to few hundred milliseconds because the power system sources remain stationary in this short period of time. Therefore, a very simple method to derive incremental quantities in the time-domain is illustrated in Equation 5:

$$\Delta x_{(t)} = x_{(t)} - x_{(t-p\cdot T)} \qquad \text{Eq. 5}$$

where:
- $\Delta x$ is the instantaneous incremental quantity;
- x is the measured instantaneous value;
- T is the power system cycle; and
- p is a number of power cycles.

Equation 5 yields an incremental quantity ($\Delta x$) that lasts for p power cycles, after which the quantity expires because the historical value subtracted ($x_{(t-p\cdot T)}$) slides into the fault period. The value of p may be selected depending on the intended usage of the incremental quantity. For example, if it is intended to use incremental quantities during two power cycles, the p is selected as p>2, such as p=3.

The time-domain incremental quantities obtained from Equation 5 contain all frequency components of the fault-generated signal. The fundamental-frequency component does not include the effect of load. Depending on the usage of the incremental quantities, the signal from Equation 5 may be further filtered to obtain the frequencies of interest. For example, fundamental-frequency band-pass filtering may be performed, and Equation 5 applied in the frequency domain using phasor quantities.

Figure 4A:
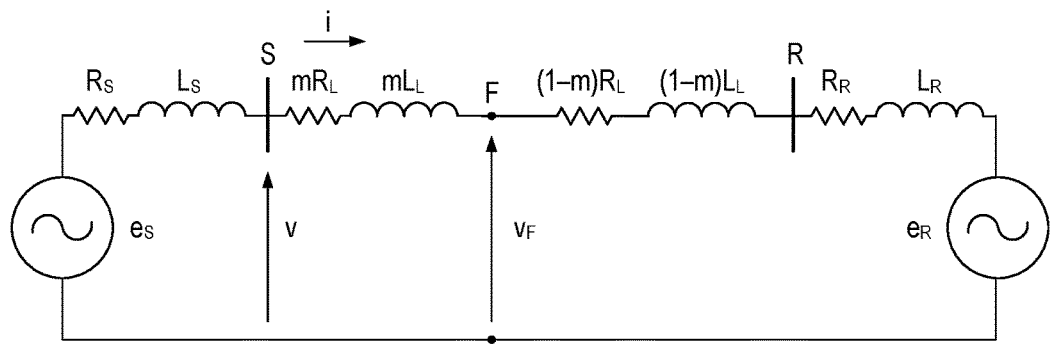
FIG. 4A illustrates an equivalent single-phase network with a local Terminal S and a remote Terminal R, with a fault on a line between terminals S and R consistent with certain embodiments of the present disclosure.
Figure 4B:
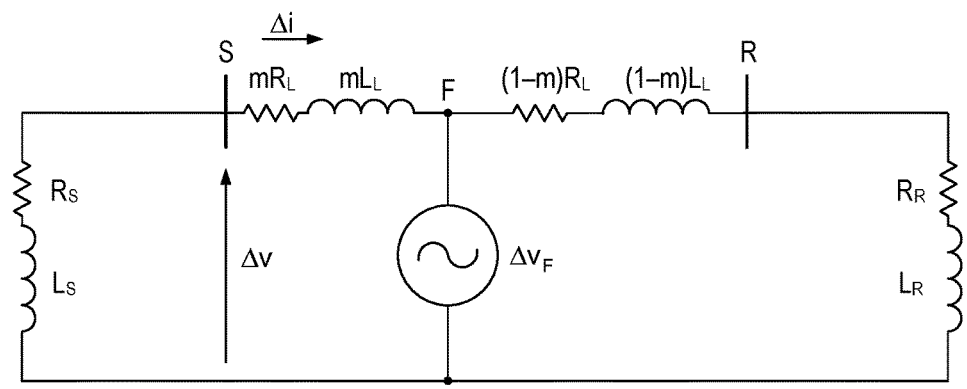
FIG. 4B illustrates another equivalent single-phase network that has been simplified for analysis of incremental quantities consistent with certain embodiments of the present disclosure.

FIG. 4A illustrates an equivalent single-phase network with a local Terminal S and a remote Terminal R, with a fault on a line between terminals S and R consistent with certain embodiments of the present disclosure. The fault network contains incremental voltages and currents that may be used for protection of the network as further described herein. FIG. 4B illustrates another equivalent single-phase network that has been simplified for analysis of incremental quantities consistent with certain embodiments of the present disclosure. At the location S of the network, the incremental voltage and current are related by a simple voltage drop equation across the Source S resistance and inductance illustrated by Equation 6:

$$\Delta v = -\left(R_S \cdot \Delta i + L_S \cdot \frac{d}{dt} \Delta i\right) \qquad \text{Eq. 6}$$

Equation 6 may be scaled for the ease of use by multiplying and dividing each side by the Source S impedance as shown in Equation 7:

$$\Delta v = -|Z_S| \left(\frac{R_S}{|Z_S|} \cdot \Delta i + \frac{L_S}{|Z_S|} \cdot \frac{d}{dt} \Delta i\right) \qquad \text{Eq. 7}$$

The current term in Equation 7 may be replaced by a new current term that is the combination of the instantaneous incremental current and its derivative as shown in Equations 8 and 9:

$$\Delta i_Z = D_0 \cdot \Delta i + D_1 \cdot \frac{d}{dt} \Delta i \qquad \text{Eq. 8}$$

where:

$$D_0 = \frac{R_S}{|Z_S|}, \; D_1 = \frac{L_S}{|Z_S|} \qquad \text{Eq. 9}$$

Equation 7 may then be re-written as Equation 10:

$$\Delta v = -|Z_S| \cdot \Delta i_Z \qquad \text{Eq. 10}$$

Equation 10 is similar to the voltage-current expression for phasors in the frequency domain, as shown in Equation 11:

$$\Delta V = -Z_S \cdot \Delta I \qquad \text{Eq. 11}$$

The current term $\Delta i_Z$ is referred to herein as the "replica current". The replica current may allow for the re-use—in the time domain—of expressions from the frequency domain such as those used with phasors. By selecting $D_0$ and $D_1$ coefficients a unity gain may be obtained between the measured current and the replica current at the system fundamental frequency. The unity gain may be useful for setting an element using time-domain quantities as further described hereinafter.

For reverse faults, the $\Delta v_F$ source of FIG. 4B may be placed behind the S terminal. In this case, the incremental voltage—incremental current Equation 12 may be deduced:

$$\Delta v = |Z_L + Z_R| \cdot \Delta i_Z \qquad \text{Eq. 12}$$

Figure 5A:
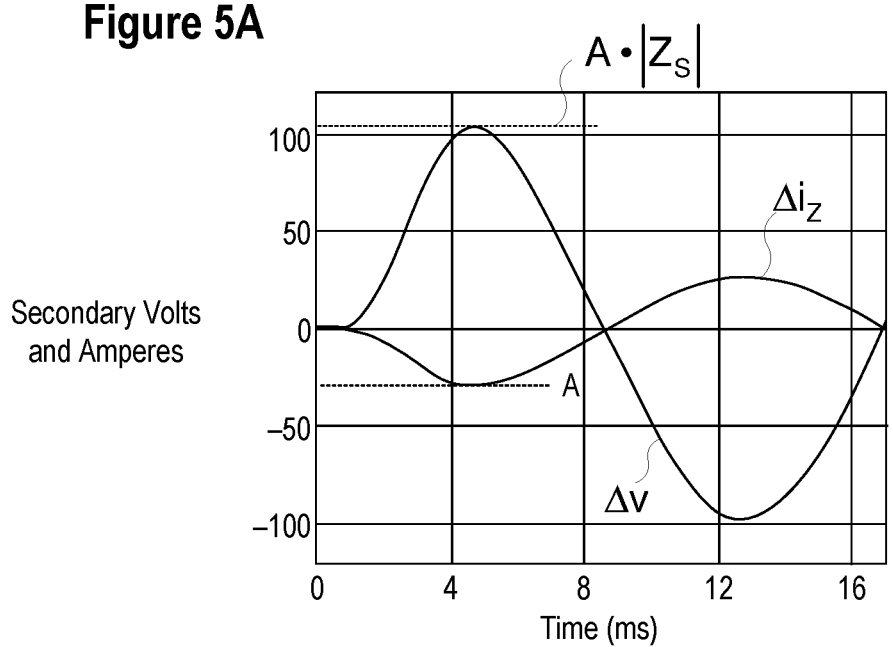
FIG. 5A illustrates a plot over time of the incremental voltage and incremental replica current for a forward fault consistent with certain embodiments of the present disclosure.
Figure 5B:
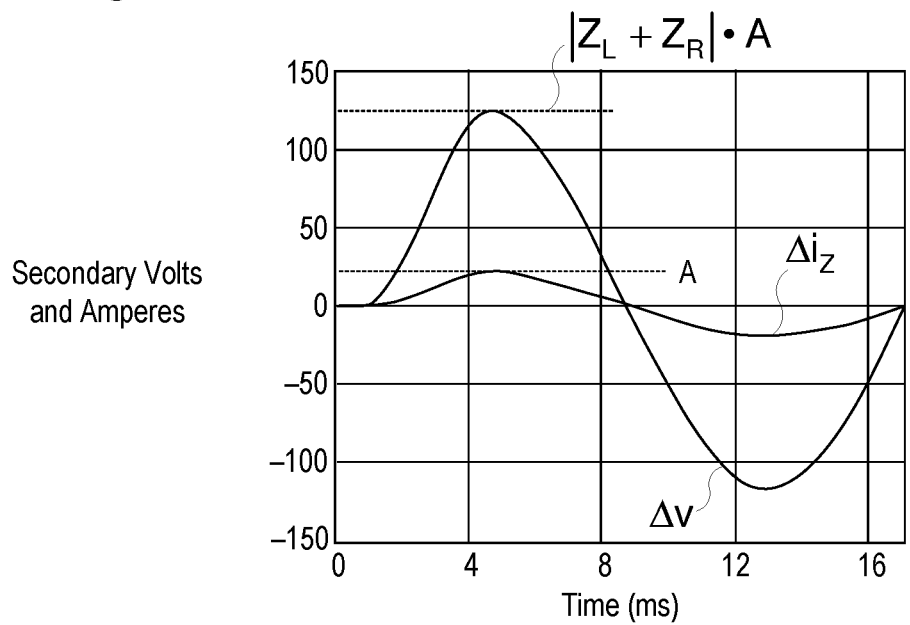
FIG. 5B illustrates a plot over time of the incremental replica voltage and incremental replica current for a reverse fault consistent with certain embodiments of the present disclosure.

FIG. 5A illustrates a plot over time of the incremental voltage and incremental replica current for a forward fault consistent with embodiments of the present disclosure. Similarly, FIG. 5B illustrates a plot over time of the incremental replica voltage and incremental replica current for a reverse fault consistent with embodiments of the present disclosure. FIG. 5A and FIG. 5B illustrate that the incremental replica currents have similar waveforms and their relative polarities may be used to indicate fault direction. Specifically, where the polarity of $\Delta v$ is opposite of the polarity of $\Delta i_Z$, as in FIG. 5A, the fault may be a forward fault; and where the polarity of $\Delta v$ is the same as the polarity of $\Delta i_Z$, as in FIG. 5A, the fault may be a reverse fault. Further, the amplitude relationship between incremental voltage and incremental replica current depends on the system parameters and the fault direction.

Various embodiments consistent with the present disclosure may utilize adaptive operating thresholds in connection with the directional protection principle. As described in connection with FIG. 5A and FIG. 5B, the incremental voltage $\Delta v$ and the incremental replica current $\Delta i_Z$ have opposite polarities for forward faults and of the same polarity for reverse faults. Moreover, the peak amplitude of the incremental voltage equals $|Z_S|$ times the peak amplitude of the incremental replica current for forward faults according to Equation 10, and it equals $|Z_L + Z_R|$ times the peak amplitude of the incremental replica current for reverse faults, according to Equation 12. This relationship may be used in certain embodiments to establish operating quantities for incremental voltage and incremental replica current. An instantaneous operating quantity $s_{OP}$ may be calculated from Equation 13:

$$s_{OP} = \Delta v \cdot \Delta i_Z \qquad \text{Eq. 13}$$

Substituting Equation 10 into Equation 13 yields an instantaneous operating quantity $s_{OP}$ for forward faults in Equation 14:

$$s_{OP} = -|Z_S| \cdot (\Delta i_Z)^2 \qquad \text{Eq. 14}$$

Similarly, substituting Equation 12 into Equation 13 yields an instantaneous operating quantity $s_{OP}$ for reverse faults in Equation 15:

$$s_{OP}=|Z_L+Z_R|\cdot(\Delta i_Z)^2 \qquad \text{Eq. 15}$$

The instantaneous operating signal $s_{OP}$ is negative for forward faults and positive for reverse faults from the very first fault sample if the input voltages and currents are sufficiently filtered. In one embodiment, therefore, the directional element may determine the direction to the fault (forward or reverse) by comparing the value of $s_{OP}$ against zero.

In another embodiment, the value of $s_{OP}$ may be compared with two adaptive thresholds, the forward adaptive threshold ($s_{FWD}$) and the reverse adaptive threshold ($s_{REV}$), defined using Equations 16 and 17 to determine the direction to the fault:

$$s_{FWD}=-Z_{FWD}\cdot(\Delta i_Z)^2 \qquad \text{Eq. 16}$$

$$s_{REV}=+Z_{REV}\cdot(\Delta i_Z)^2 \qquad \text{Eq. 17}$$

where values of $Z_{FWD}$ and $Z_{REV}$ are predetermined settings. The values of $Z_{FWD}$ and $Z_{REV}$ may be similarly calculated using the source and remote impedances using equations 18 and 19:

$$Z_{FWD}=0.5\cdot|Z_S| \qquad \text{Eq. 18}$$

$$Z_{REV}=0.5\cdot|Z_L| \qquad \text{Eq. 19}$$

Using equations 13-19, a forward fault may be indicated when Equation 20 is satisfied:

$$s_{OP}<s_{FWD} \qquad \text{Eq. 20}$$

Furthermore, a reverse fault may be indicated when Equation 21 is satisfied:

$$s_{OP}>s_{REV} \qquad \text{Eq. 21}$$

Equations 20 and 21 are typically satisfied by samples during the fault transient period. In certain embodiments, the operating quantity $s_{OP}$ may be averaged and the adaptive thresholds $s_{FWD}$ and $s_{REV}$ may also be averaged over a time. Such embodiments may reduce noise in the signal. The time window over which the signals are averaged may be relatively brief to facilitate rapid detection of faults. In various embodiments, an IED consistent with embodiments of the present disclosure may use equations 16-21 to detect the direction of a fault in an electric power system. IEDs, such as those illustrated in FIG. 1, are often configured to share information useful in protecting the electric power delivery system.

Figure 6:
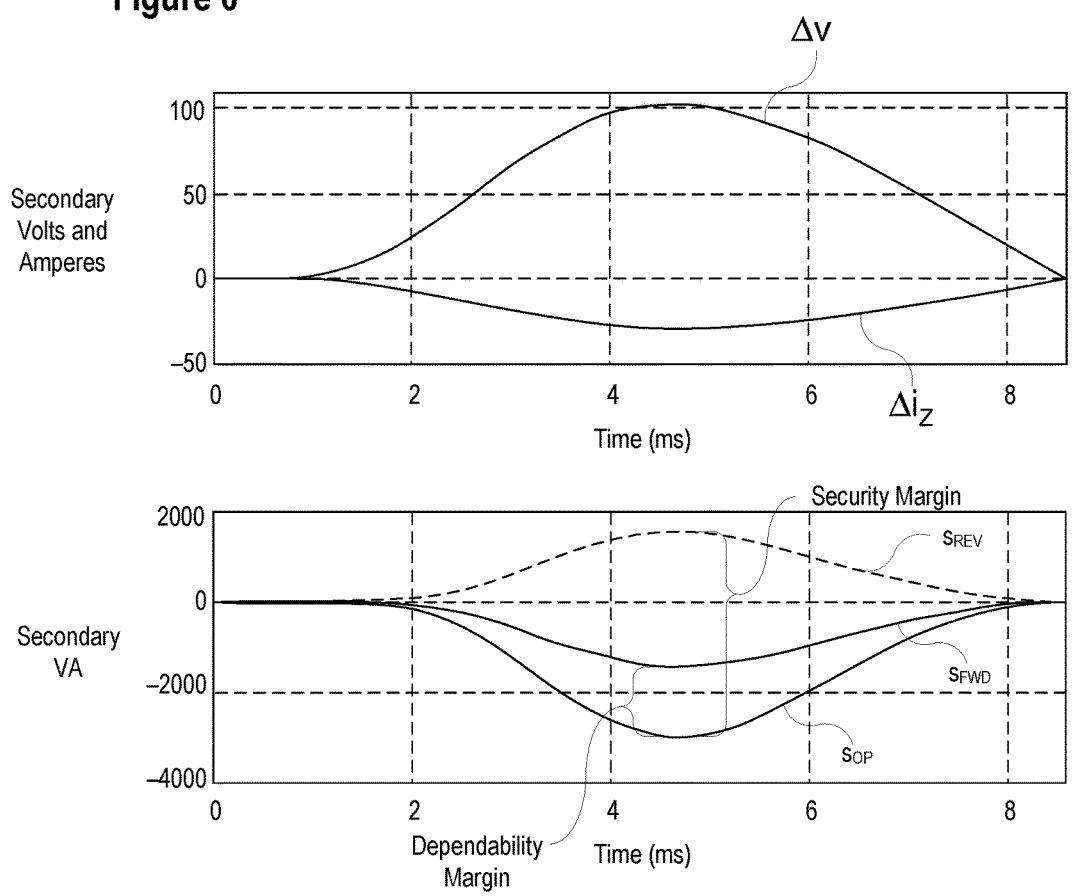
FIG. 6 illustrates a plot over time of a direction element operation for a forward fault consistent with certain embodiments of the present disclosure.

FIG. 6 illustrates a plot over time of a direction element operation for a forward fault consistent with certain embodiments of the present disclosure. As expected for a forward fault, the operating signal ($s_{OP}$) is negative. The forward adaptive threshold ($s_{FWD}$), which is calculated using Eq. 16, is negative and is equal to about half the operating signal. The difference between the forward adaptive threshold ($s_{FWD}$) and the operating signal ($s_{OP}$) may be referred to as a dependability margin.

The operating signal ($s_{OP}$), the reverse adaptive threshold ($s_{REV}$), and the forward adaptive threshold ($s_{FWD}$) are not averaged in this example. In embodiments in which averaging is used, the averaging would reduce the rate of change of these signals, but would not affect the relationship between the operating signal and the thresholds. Based on the conditions illustrated in FIG. 6, systems and methods consistent with the present disclosure would identify a forward fault.

In various embodiments, systems and methods consistent with the present disclosure may rely on one-end voltage and current measurements, and as such, may not need to receive communications or quantities from another IED to determine fault direction using time-domain quantities. In one embodiment, an IED may include a directional module using the directional element configured to determine the direction of a fault based on Eq. 16 through Eq. 21 above, and as described in connection with FIG. 6. Such a directional module may be configured to operate only in an area of protection that falls short of a remote terminal. Such a configuration may be referred to herein as "underreach."

In various embodiments, various techniques may be utilized to avoid "overreach" of the designated area of protection. Such a directional module may further include transient overreach control. One such technique may be illustrated with reference to the system illustrated in FIG. 4B. In FIG. 4B, the voltage at the fault point may be represented by Equation 22:

$$\Delta v-m\cdot|Z_L|\cdot\Delta i_Z=\Delta V_F \qquad \text{Eq. 22}$$

In Eq. 22, m represents a distance to the fault normalized for the line length. The distance module may be configured to "reach" up to a certain point ($m=m_0$) on the protected line, where $m_0$ is short of the remote bus. Accordingly, the distance module may not "reach" faults beyond $m_0$. From the Thévenin's theorem, the highest fault voltage $\Delta V_F$ is the system voltage ($V_{SYS}$) plus some margin for possible pre-fault overvoltage. In some embodiments, the system voltage is the nominal system voltage. Thus, selective tripping may be calculated using Equation 23:

$$|\Delta V_F|>k_0\cdot V_{SYS} \qquad \text{Eq. 23}$$

where $k_0$ is greater than unity. In one embodiment, $k_0$ may be 1.1.

Using equations 22 and 23, an operating equation for an underreach configuration may be calculated using Equations 24A and 24B:

$$S_{OP\_U}=|\Delta v-m_0\cdot|Z_L|\cdot\Delta_{iZ}| \qquad \text{Eq. 24A}$$

$$S_{OP\_U}>k_0\cdot V_{SYS} \qquad \text{Eq. 24B}$$

Using Equation 24A, an underreaching element may issue a trip command if the calculated voltage of the underreach operating signal, $S_{OP\_U}$, at the intended reach point $m_0$ is greater than $k_0\cdot V_{SYS}$, as stated in Eq. 24B. In one embodiment, the value of system voltage $V_{SYS}$ may be a setting specified by a user.

Figure 7A:
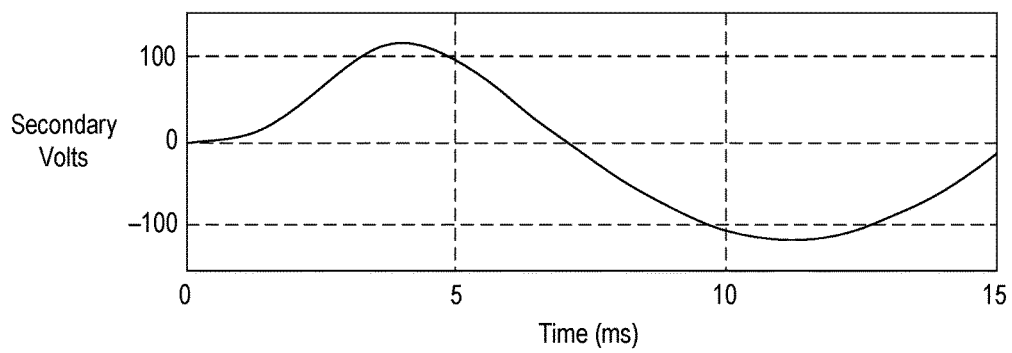
FIG. 7A illustrates a plot over time of an incremental voltage, for an in-zone fault occurring near the voltage peak and located at approximately 60% of the set reach point of a directional element consistent with one embodiment of the present disclosure.
Figure 7B:
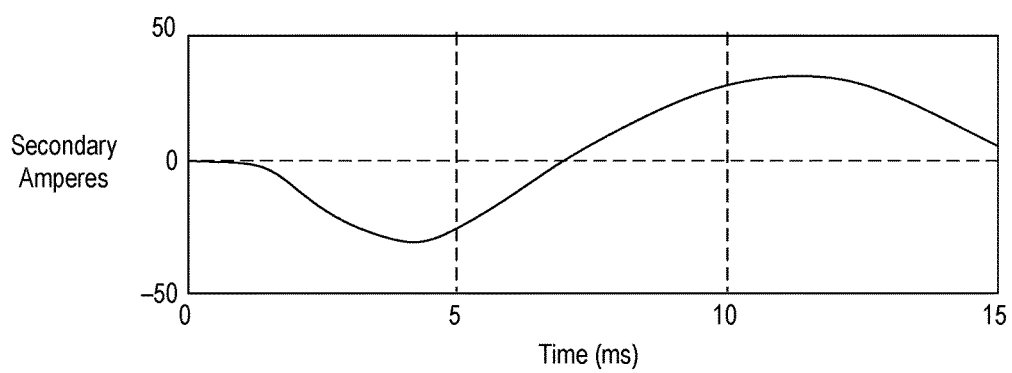
FIG. 7B illustrates a plot over time of an incremental replica current under the same conditions illustrated in FIG. 7A consistent with one embodiment of the present disclosure.
Figure 7C:
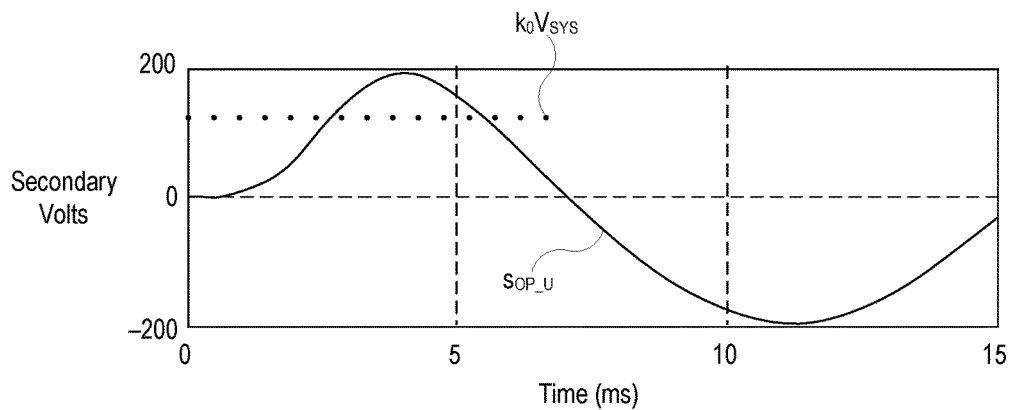
FIG. 7C illustrate a plot over time of an operating signal under the same conditions illustrated in FIG. 7A consistent with one embodiment of the present disclosure.

FIG. 7A illustrates a plot over time of an incremental voltage, for an in-zone fault occurring near the voltage peak and located at approximately 60% of the set reach point of a directional element consistent with one embodiment of the present disclosure. FIG. 7B and FIG. 7C illustrate plots over time of an incremental replica current and an operating signal, respectively, under the same conditions illustrated in FIG. 7A. The quantity $k_0\cdot V_{SYS}$ is illustrated in FIG. 7C, and the point at which $S_{OP\_U}$ crosses the quantity $k_0\cdot V_{SYS}$, an underreach element may issue a trip command.

The voltage at the fault point collapses very steeply during line faults. As a result, the left-hand side of Eq. 24, which may correspond to a measurement of the value of $|\Delta v_F|$, reflects the step change of the fault point voltage. Accordingly, Eq. 24 becomes satisfied quickly for in-zone faults occurring near the voltage peak, as illustrated in FIG. 7C. In the illustrated embodiment, the initial rise of the value of $S_{OP\_U}$ is slowed down by a digital low-pass filter. A low-pass filter may facilitate the use of the RL line and system model illustrated in FIG. 4. By changing the cutoff frequency of the filter, the balance between speed and security may be controlled.

In certain electric power delivery systems, the voltage of the system may differ from the nominal voltage. For example, a utility may operate an electric power system at a voltage of 110% of the nominal voltage. Such an increase may be beneficial in that more power may be transferred with less loss on a percentage basis. However, such operation may increase the risk of faults or damage to equipment. Utilities may conversely operate an electric power system below the nominal voltage. Although this may increase the percentage of power loss in transmission, it may also decrease the risk of fault or equipment damage.

In one embodiment, a setting is used to compensate for operation of the electric power system at a voltage that is not the nominal voltage, the system voltage $V_{SYS}$ used in Equation 24 may be calculated using measured system voltages. In such embodiments, the system voltage may be a root-mean square value of measured voltage. The voltage may be an average of the absolute peak values of the voltage. The system voltage may be continuously measured and updated during steady state or during non-fault events. The system voltage may be measured and updated on a periodic basis such as once a cycle or once every few cycles, or the like.

Equation 24 may be re-arranged to produce Equation 25:

$$\left|\frac{\Delta v}{m_0} - |Z_L| \cdot \Delta i_Z\right| > \frac{k_0 \cdot V_{SYS}}{m_0} \qquad \text{Eq. 25}$$

or $$m_0 > \frac{k_0 \cdot V_{SYS}}{\left|\frac{\Delta v}{m_0} - |Z_L| \cdot \Delta i_Z\right|}$$

In certain embodiments, equations representing the underreaching element (e.g., Eqs. 24-25) may be used in a directional module to determine a direction to a fault and to determine whether the fault is within a zone of protection of the directional module using time-domain quantities without measurements from another IED. The directional module may also use Equations 16-21 to determine the direction to the fault. In one embodiment, the directional module determines a direction to the fault using Equations 16-21. If the fault is in the forward direction, the directional module may determine whether the fault is within a predetermined zone of protection using Equations 24-25. If, the fault is calculated to be in the forward direction and within the predetermined zone of protection, then the directional element may issue a protection command. For example, the IED with the directional element may then issue an open command to a circuit breaker or take a similar action to protect the line from the fault.

Figure 8:
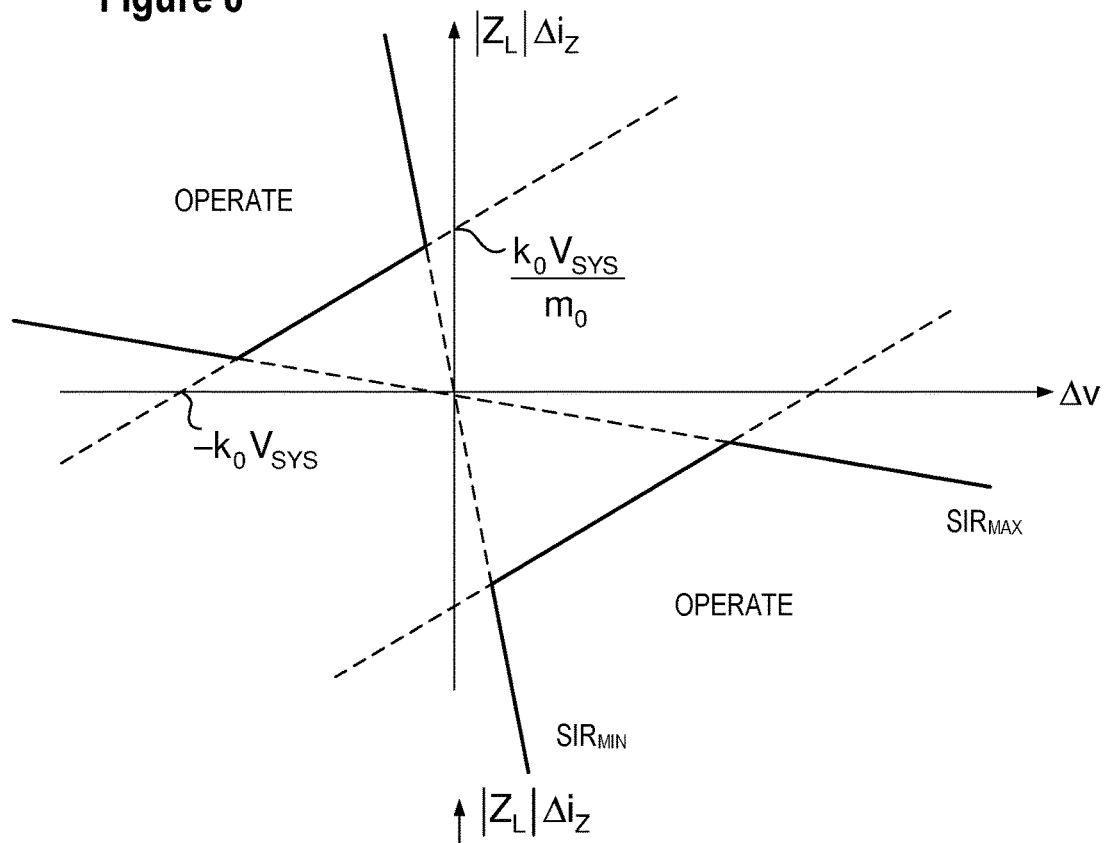
FIG. 8 illustrates an operating characteristic of an underreaching element with directional supervision consistent with certain embodiments of the present disclosure.

FIG. 8 illustrates an operating characteristic of an underreaching element with directional supervision consistent with certain embodiments of the present disclosure. In the illustrated embodiment, the x-axis represents $\Delta v$ and the y-axis represents $|Z_L| \cdot \Delta i_Z$. Equation 25 is plotted in FIG. 8, together with an alternate representation of Eq. 10. Eq. 10 may also be expressed in terms of the product of the line impedance and the replica current, as shown in Eq. 26.

$$\Delta v = -|Z_s| \cdot \Delta i_Z = -\frac{|Z_S|}{|Z_L|} \cdot |Z_L| \cdot \Delta i_Z = -SIR \cdot |Z_L| \cdot \Delta i_Z \qquad \text{Eq. 26}$$

In Eq. 26, SIR is the source-to-line impedance ratio (i.e., $|Z_S|/|Z_L|$), which is a quantity that may range between a high value $SIR_{MAX}$ and a low value $SIR_{MIN}$.

Figure 9:
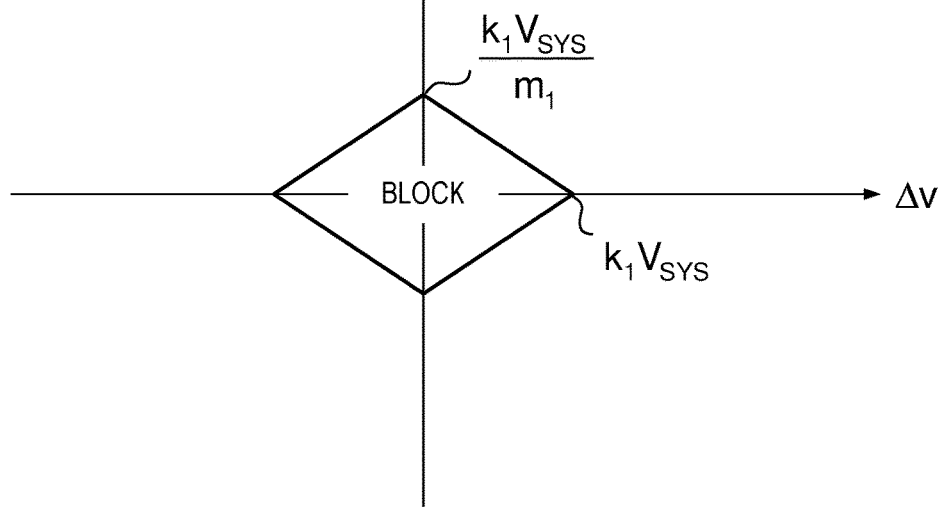
FIG. 9 illustrates an operating characteristic of an overreaching nondirectional element consistent with certain embodiments of the present disclosure.

FIG. 9 illustrates an operating characteristic of an overreaching nondirectional element consistent with certain embodiments of the present disclosure. In various embodiments, an overreaching element may be configured to selectively enable or disable a directional element. An operating characteristic of one embodiment of an overreaching element may be determined based on Eq. 24. The overreaching nondirectional element may reach beyond a remote line terminal up to the m1 point (m1>1 pu) and to respond to faults that generate a relatively small change in the voltage. As such, the operating characteristic may be specified by Eq. 27.

$$|\Delta v - m_1 \cdot |Z_L| \cdot \Delta i_Z| > k_1 \cdot V_{SYS} \qquad \text{Eq. 27}$$

In yet another embodiment, a directional module may determine whether a fault is in the forward or reverse direction using the time-domain quantities of incremental voltage $\Delta v$ and incremental current $\Delta i$. For a short initial period of time after a fault (or other step-change), the current change and voltage change may be related to the fault direction. The current change and voltage change are of opposite polarities for forward faults, and the same polarity for reverse faults. Thus, in one embodiment, the directional module may compare the polarities of the incremental voltage and the incremental current. When the incremental voltage and incremental current are of the same polarity, the distance module may determine that the fault is in the forward direction, and enable a fault detection and location calculation module. When the incremental voltage and incremental current are of the same polarity, however, the distance module may determine that the fault is in the reverse direction and block the fault detection and location calculation module.

After a short initial time from the fault, the electric power system changes from exhibiting purely resistive behavior to the resistive-inductive behavior. At such time, the incremental replica current $\Delta i_Z$ begins to describe the system better than does the incremental current $\Delta i$. Accordingly, in some embodiments, a directional element may utilize detection techniques appropriate to determine a fault direction based on the resistive behavior present for a short window of time following a fault, or based on the resistive-inductive behavior that persists for longer periods of time. In one embodiment, the directional module may include a short time window (e.g., a window of 1 ms or 2 ms) during which the incremental current (instead of the incremental replica current) may be used to determine direction to the fault by comparison of the incremental current polarity against the polarity of the incremental voltage. After the window of time, the directional element may switch to using equations 16-21 to determine the direction to the fault based on the incremental quantities that better reflect the resistive-inductive behavior of the network.

In electric power systems that include multiple phases (e.g., three-phase alternating current electric power delivery systems), a fault may involve more than one phase and/or may affect more than one phase. That is, in multi-phase systems, several fault types are possible, including single-phase-to-ground faults, phase-to-phase faults, phase-to-phase-to-ground faults, three-phase faults, and the like. In several embodiments herein, the fault detection and location calculation may be independent from the fault type in the actual multiple-phase power system.

For a three-phase (A, B, and C) power system, in the frequency domain, an A-phase to ground (AG) fault voltage drop in the A phase may be represented by Equation 28:

$$V_A = Z_1 I_1 + Z_2 I_2 + Z_0 I_0 \quad\quad \text{Eq. 28}$$

where:
$V_A$ is the voltage drop in the A phase;
$Z_1$ is the positive-sequence impedance;
$I_1$ is the positive-sequence current;
$Z_2$ is the negative-sequence impedance;
$I_2$ is the negative-sequence current;
$Z_0$ is the zero-sequence impedance; and
$I_0$ is the zero-sequence current.

Equation 28 may be re-arranged to obtain a relationship between the faulted phase voltage, the positive-sequence impedance and a new current $I_{AG}$ referred to as the "loop current" in Equation 29:

$$V_A = Z_1 I_{AG} \quad\quad \text{Eq. 29}$$

The loop current that makes Equation 28 conform with the format of Equation 29 is shown in Equation 30:

$$I_{AG} = I_A \cdot 1\angle\Theta_1 - I_0 \cdot 1\angle\Theta_1 + \frac{|Z_0|}{|Z_1|} I_0 \cdot 1\angle\Theta_0 \quad\quad \text{Eq. 30}$$

where:
$I_A$ is the A-phase current; and
$\Theta_0$ and $\Theta_1$ are the angles of the zero- and positive-sequence line impedances ($Z_0$ and $Z_1$), respectively.

Returning to the replica current of Equation 8, at nominal system frequency, the replica current $\Delta i_Z$ is a voltage drop across an RL circuit with a gain of one. Thus, Equation 30 may be restated with that substitution as Equation 31:

$$f_{IZ}(\Delta i, R, L) = D_0(R, L) \cdot \Delta i + D_1(R, L) \cdot \frac{d}{dt} \Delta i \quad\quad \text{Eq. 31}$$

where $D_0$ and $D_1$ are given by Equation 9. Equation 28 may thus be used to calculate the loop current in the time domain using Equation 30:

$$i_{AG} = f_{IZ}(i_A, R_1, L_1) - f_{IZ}(i_0, R_1, L_1) + \frac{|Z_0|}{|Z_1|} f_{IZ}(i_0, R_0, L_0) \quad\quad \text{Eq. 32}$$

where $R_1$ and $L_1$ and $R_0$ and $L_0$ are the resistance and inductance of the positive- and zero-sequence line impedances.

Equations 33-37 calculate several quantities that may be used in the calculation of loop voltages and currents:

$$\Delta i_0 = \frac{1}{3}(\Delta i_A + \Delta i_B + \Delta i_C) \quad\quad \text{Eq. 33}$$

$$\Delta i_{0Z} = f_{IZ}(i_0, R_1, L_1) - \frac{|Z_0|}{|Z_1|} f_{IZ}(i_0, R_0, L_0) \quad\quad \text{Eq. 34}$$

$$i_{AZ} = f_{IZ}(i_A, R_1, L_1) \quad\quad \text{Eq. 35}$$

$$i_{BZ} = f_{IZ}(i_B, R_1, L_1) \quad\quad \text{Eq. 36}$$

$$i_{CZ} = f_{IZ}(i_C, R_1, L_1) \quad\quad \text{Eq. 37}$$

Quantities in Equations 33-37 may be used to calculate loop voltages and currents according to Table 1:

| Loop | Voltage | Current |
| --- | --- | --- |
| AG | $\Delta v_A$ | $\Delta i_{AZ} - \Delta i_{0Z}$ |
| BG | $\Delta v_B$ | $\Delta i_{BZ} - \Delta i_{0Z}$ |
| CG | $\Delta v_C$ | $\Delta i_{CZ} - \Delta i_{0Z}$ |
| AB | $\Delta v_A - \Delta v_B$ | $\Delta i_{AZ} - \Delta i_{BZ}$ |
| BC | $\Delta v_B - \Delta v_C$ | $\Delta i_{BZ} - \Delta i_{CZ}$ |
| CA | $\Delta v_C - \Delta v_A$ | $\Delta i_{CZ} - \Delta i_{AZ}$ |

Calculation of a fault and fault location may then be performed for specific fault type by using the correct voltage and current quantities as calculated using Table 1. For example, a directional module may calculate an underreach condition using Equation 24, where the incremental voltage in the time domain $\Delta v$ and the incremental replica current $\Delta i_Z$ used for the calculation is the appropriate incremental voltage for the fault type from Table 1, and the incremental replica $\Delta i_Z$ current used is the appropriate incremental replica current from Table 1. That is, if the fault type is an A-phase-to-ground fault, the incremental voltage used is $\Delta v_A$, and the incremental replica current used is $\Delta i_{AZ} - \Delta i_{0Z}$. If the fault type is an A-phase-to-B-phase fault, the incremental voltage used is $\Delta v_A - \Delta v_B$, and the incremental replica current used is $\Delta i_{AZ} - \Delta i_{BZ}$.

Selection of the appropriate faulted phases for use of the appropriate fault loop quantities, above, may require identification of the faulted phases. According to one embodiment, to quickly determine which phase or phases are the faulted phase or phases, the relative incremental current quantities of each phase may be made. The phase(s) experiencing the greatest relative incremental current quantities may be determined as the faulted phase(s).

In another embodiment, the operating signals, such as those calculated using Equation 13 calculated for each of the loops allows for selecting the faulted phases. For example, the operating quantities for each loop are calculated as shown in Table 2:

| Loop | $S_{OP} =$ |
| --- | --- |
| AG | $\Delta v_A * (\Delta i_{AZ} - \Delta i_{0Z})$ |
| BG | $\Delta v_B * (\Delta i_{BZ} - \Delta i_{0Z})$ |
| CG | $\Delta v_C * (\Delta i_{CZ} - \Delta i_{0Z})$ |
| AB | $(\Delta v_A - \Delta v_B) * (\Delta i_{AZ} - \Delta i_{BZ})$ |
| BC | $(\Delta v_B - \Delta v_C) * (\Delta i_{BZ} - \Delta i_{CZ})$ |
| CA | $(\Delta v_C - \Delta v_A) * (\Delta i_{CZ} - \Delta i_{AZ})$ |

Once the operating quantities are calculated for each loop, the operating quantities may be compared. The loop with the highest operating quantity is the faulted loop. Once the faulted loop is determined, the incremental voltage and incremental current quantities associated with that loop (from Table 1) may be used to determine underreach and directional quantities. The above techniques may be used by an IED such as IEDs 102, 104 of FIG. 1 to determine the direction to a fault and whether the fault is in a zone of protection.

Figure 10:
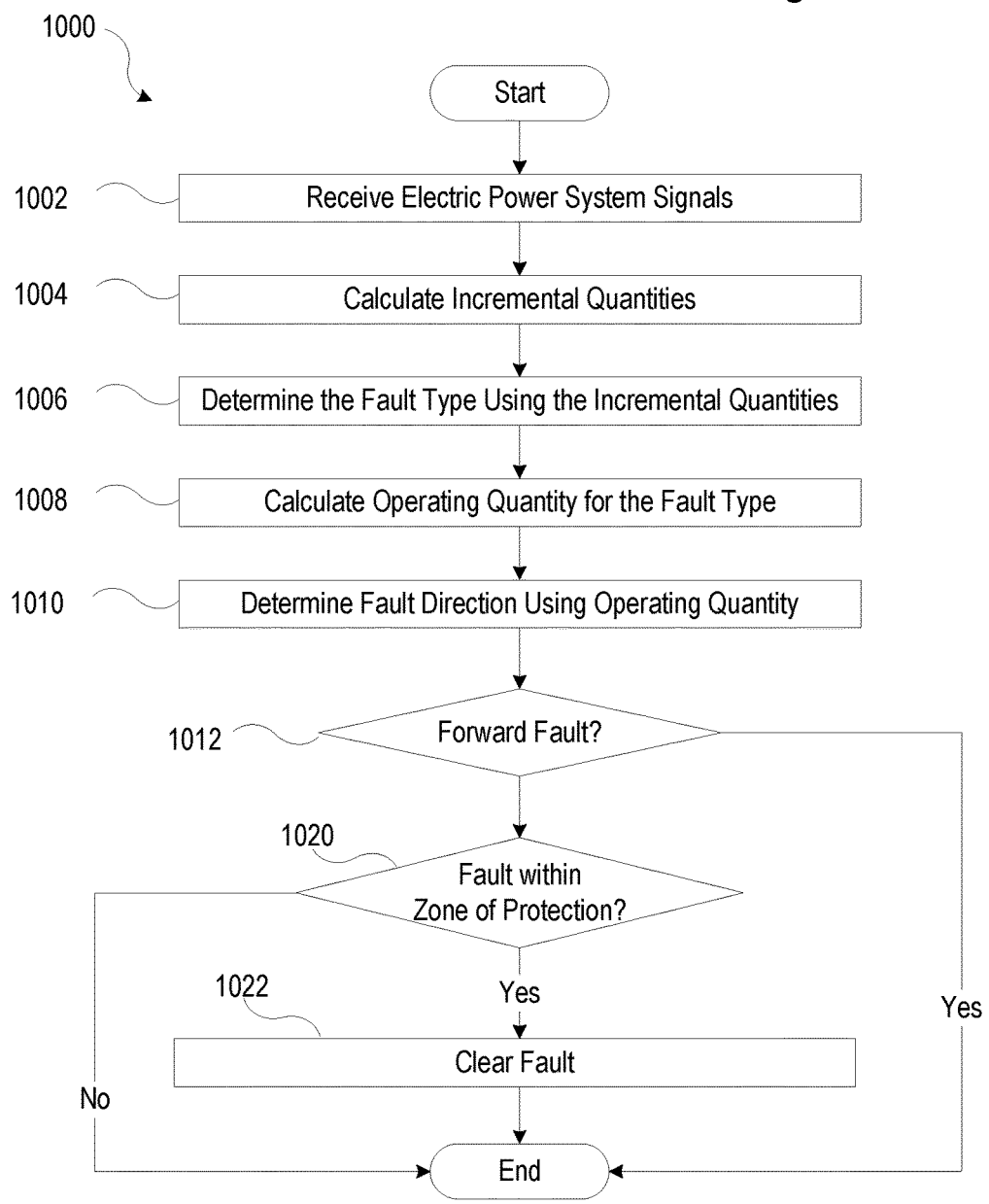
FIG. 10 illustrates a flowchart of one embodiment of a method for determining a direction to a fault using time-domain quantities consistent with certain embodiments of the present disclosure.

FIG. 10 illustrates a flowchart of one embodiment of a method 1000 for determining a direction to a fault using time-domain quantities consistent with embodiments of the present disclosure. The method 1000 starts by receiving electric power system signals at 1002 and calculating therefrom incremental quantities (e.g., $\Delta i_Z$ and $\Delta v$) at 1004. Based on the incremental qualities, method 1000 may then determine the fault type at 1006. In a three phase system, the fault type may be determined using equations 33-37. The method may then calculate an operating quantity for the fault type at 1008. The operating quantity may be used to determine a fault direction. The operating quantity may be calculated using, for example, equations 13-15, and may use the incremental quantities of Table 1 depending on the fault type. That is, the operating quantity may be calculated using the equations of Table 1. The direction (forward or reverse) to the fault may then be determined at 1010 using the operating quantities shown in Table 1. In some embodiments, the method 1000 may use incremental quantities to calculate the operating quantity directly using Equation 13, without using the incremental quantities of Table 1.

If the fault is a forward fault, at 1012, method may end, and otherwise, method 1000 may determine at 1020 whether the fault is within the zone of protection. Any of the techniques disclosed herein for assessing a zone of protection may be used in various embodiments. If the fault is determined to be within the zone of protection, at 1020, the fault may be cleared at 1022.

Figure 11:
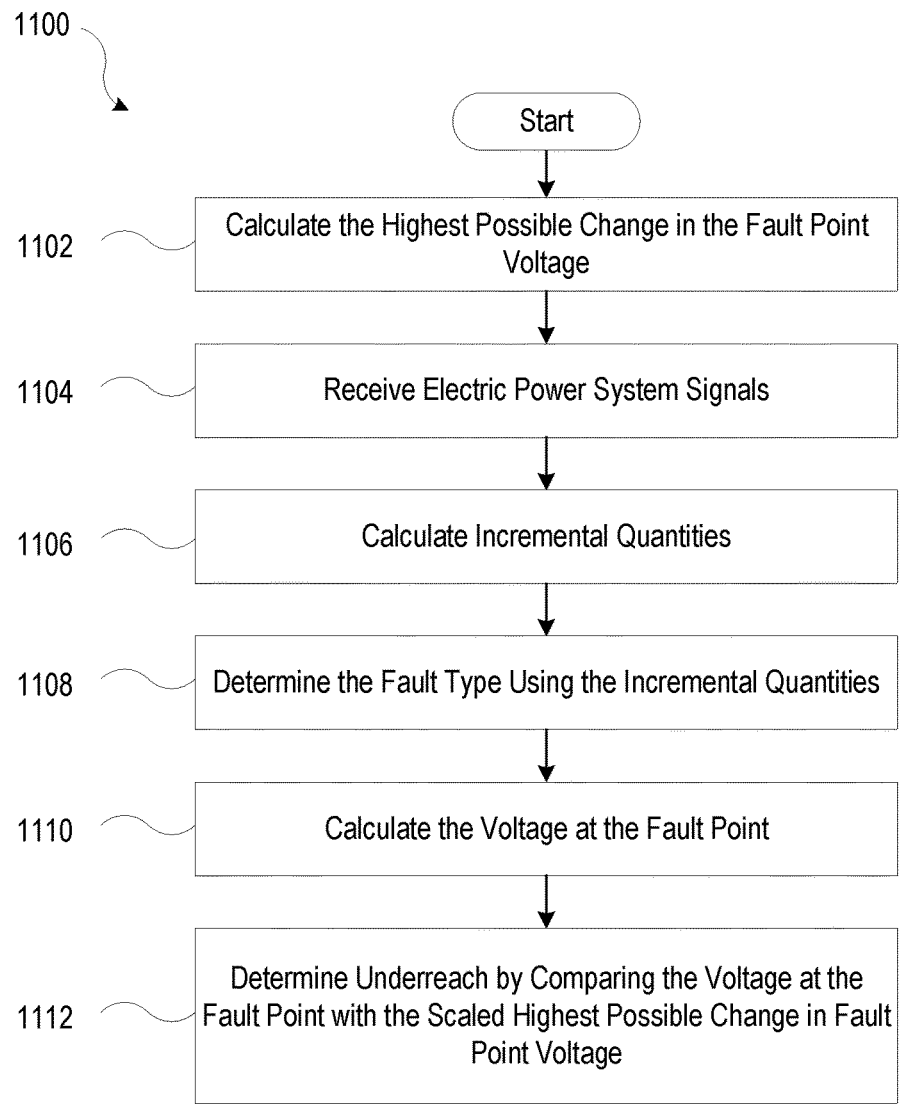
FIG. 11 illustrates a flow diagram of one embodiment of a method for determining whether a fault is within a zone of protection consistent with the present disclosure.

FIG. 11 illustrates a flow diagram of one embodiment of a method 1100 for determining whether a fault is within a zone of protection consistent with the present disclosure. The method 1100 starts by calculating the highest possible fault voltage at 1102 using, for example, Equation 23. In some embodiments, the highest possible fault voltage may be calculated once and stored for later use. Alternatively, this may be calculated on a periodic basis using quantities measured from the electric power system as described herein. The method proceeds with receipt of electric power system signals at 1104. Using the signals, the method then calculates incremental quantities (e.g., $\Delta i_Z$ and $\Delta v$) at 1106. The method may then determine the fault type using the incremental quantities at 1108. The fault type may be determined using the operating quantities listed in Table 2. The fault voltage at the intended reach point may then be calculated at 1110 using the appropriate incremental quantities according to the determined fault type as shown in Table 1. The fault voltage at the intended reach point may then be compared with a scaled highest possible voltage at 1112. If the fault voltage at the intended reach point is greater than the scaled highest possible voltage, then underreach is determined and a fault may be declared.

Figure 12:
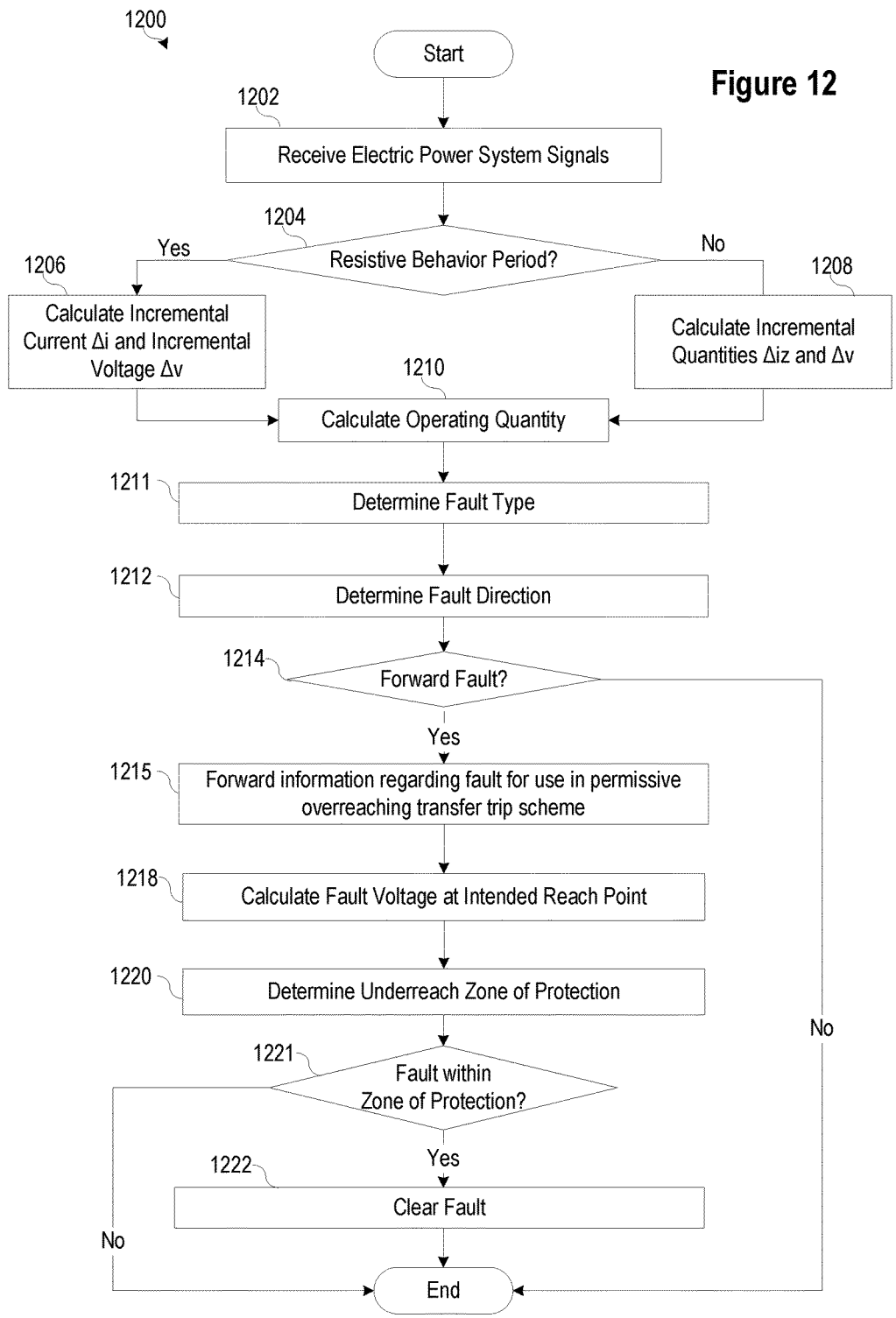
FIG. 12 illustrates one embodiment of a method for determining a direction to a fault and for determining whether the fault is within a zone of protection consistent with certain embodiments of the present disclosure.

FIG. 12 illustrates one embodiment of a method for determining a direction to a fault and for determining whether the fault is within a zone of protection consistent with certain embodiments of the present disclosure. Method 1200 starts with receiving electric power system signals at 1202. As described above, for a predetermined period the direction may be determined using incremental current during a time where the power system exhibits resistive behavior. Thus, the method may determine whether the power system exhibits resistive behavior at 1204. This determination may be made by calculating a time from the instance of the fault and during a predetermined time period the system may be assumed to be exhibiting resistive behavior. If the system is within that time period, then the method may calculate incremental current and incremental voltage as quantities $\Delta i$ and $\Delta v$ at 1206. If, however, an event occurs outside of the resistive behavior period, method 1200 may calculate incremental quantities as $\Delta i_Z$ and $\Delta v$ 1208. The method may then calculate an operating quantity 1210 using the incremental quantities determined at either 1206 or 1208. Method 1200 may determine the fault type at 1211. Fault type determination may be performed by comparing relative incremental current quantities from each phase as described above.

With the operating quantity from 1210, method 1200 may then determine the direction to the fault 1212 using, for example, equations 16-21. If, at 1214, the fault is determined to be in the reverse direction (i.e., the fault is not a forward fault), If, however, the method determines that the fault is in the forward direction at 1214, method 1200 proceeds to forward the fault direction information to a remote relay at 1216. The remote relay may utilize the information in connection with determining whether the fault is within a zone of protection.

At 1218, method 1200 may calculate fault voltage at the intended reach point. With the calculated fault voltage, method 1200 may determine underreach by comparing the fault voltage at the intended reach point with a scaled highest possible voltage at 1220. If it is determined that the fault is within the zone of protection at 1221 (the voltage at the intended reach point is greater than the scaled highest possible voltage), then the method may clear the fault at 1222. In various embodiments, the fault may be cleared by, for example, opening a breaker. After the fault is cleared, the method may end.

Fault location according to several embodiments herein may be performed using or in connection with a traveling wave differential module. The traveling wave differential module described herein overcomes the requirements for high-fidelity voltage signals of previous traveling wave fault protection techniques. In some embodiments consistent with the present disclosure, a traveling wave differential module may operate using a current-only traveling wave differential scheme by comparing values of the current waves, without isolating the incident and reflected waves as in previous traveling wave location techniques. In other embodiments, voltage signals associated with traveling waves may also be analyzed to identify a fault location.

Current waves as measured by the traveling wave differential module may be sums of the incident and reflected waves. For external faults the amplitudes of the current waves would not match between the line terminals because of the termination effects. Isolating incident and reflected waves makes the measurement independent of the termination impedances, but it requires high-fidelity voltage information.

However, the total current waves retain the polarity of the incident waves. Therefore, the amplitudes of the total current waves at both line terminals may be compared, taking into account the line propagation delay. For a healthy line the polarities will be inverted. Thus, the traveling wave differential module may determine if the fault is internal to the line using currents by making assumptions of fault direction, and checking amplitudes of the traveling waves. According to one embodiment, the traveling wave differential module may assume an internal fault, and calculate the fault current by aligning and adding the amplitudes of the first current traveling waves that arrived at the local and remote terminals respectively using, for example, Equation 38:

$$i_{OP(t)} = |i_{S(t)} + i_{R(t-P)}| \qquad \text{Eq. 38}$$

where:

$i_{OP(t)}$ is the operating current at time t;

$i_{S(t)}$ is the current at local Terminal S at the time t when the traveling wave arrives at the local Terminal S; and $i_{R(t-P)}$ is the current at remote terminal R at the time (t−P) when the traveling wave arrives at the remote terminal R, where P is the delay between the traveling wave arrival at the remote terminal and the local terminal. P≤T, where T is the line propagation delay between the local and remote terminals.

Equation 38 assumes that the traveling wave arrived at the remote (R) terminal before it arrived at the local (S) terminal. If, however, the traveling wave first arrives at the local (S) terminal, Equation 39 may be used:

$$i_{OP(t)}=|i_{S(t-P)}+i_{R(t)}| \qquad \text{Eq. 39}$$

where:

$i_{S(t-P)}$ is the current at local Terminal S at the time (t−P) when the traveling wave arrives at the local Terminal S, where P is the delay between the traveling wave arrival at the local terminal and the remote terminal, and P≤T, where T is the line propagation delay between the local and remote terminals; and $i_{R(t)}$ is the current at remote Terminal R at the time (t) when the traveling wave arrives at the remote Terminal R.

Either Equation 38 or 39 may be used depending on which terminal first received the traveling wave. Equations 38 and 39 may be executed only once, giving a single value of $i_{OP}$ that reflects (for internal faults) the total traveling wave fault current. For internal faults, the traveling wave polarities at the remote and local terminals are the same, yielding a high value when summed as in equations 38 and 39.

If the sum of the two current traveling waves is significant, then a check is made to determine that the fault is not external. In the check, the traveling wave differential module may assume an external fault, and calculates the passing through current traveling wave that would result. For external faults, the traveling wave that entered at one line terminal leaves at the other terminal after the line propagation time delay T. The check may be made by calculating current restraint quantities as shown in Equations 40 and 41:

$$i_{RT1(t)}=|i_{S(t)}-i_{R(t-T)}| \qquad \text{Eq. 40}$$

$$i_{RT2(t)}=|i_{R(t)}-i_{S(t-T)}| \qquad \text{Eq. 41}$$

Equation 40 may be executed once at the point in time t after the first traveling wave arrived at the remote Terminal R. Similarly, Equation 41 may be executed once at the point in time t after the first traveling wave arrived at the local Terminal S. The restraint quantities may be combined using, for example, Equations 42 or 43:

$$i_{RT} = \max(i_{RT1}, i_{RT2}) \qquad \text{Eq. 42}$$

$$i_{RT} = \frac{1}{2}(i_{RT1} + i_{RT2}) \qquad \text{Eq. 43}$$

Finally, the traveling wave differential module may declare a fault by comparing the operating and restraint quantities. Equation 44 may be used for such comparison:

$$i_{OP} > k \cdot i_{RT} \qquad \text{Eq. 44}$$

where:

k is a restraining factor.

In various embodiments, k comprises a user-specified factor.

In some embodiments, a traveling wave differential module consistent with the present disclosure may operate using representations of electrical conditions from terminals on opposite sides of a transmission line, where the current quantities include time stamps. The traveling wave differential module may time align the time stamped current quantities from each terminal.

Figure 13:
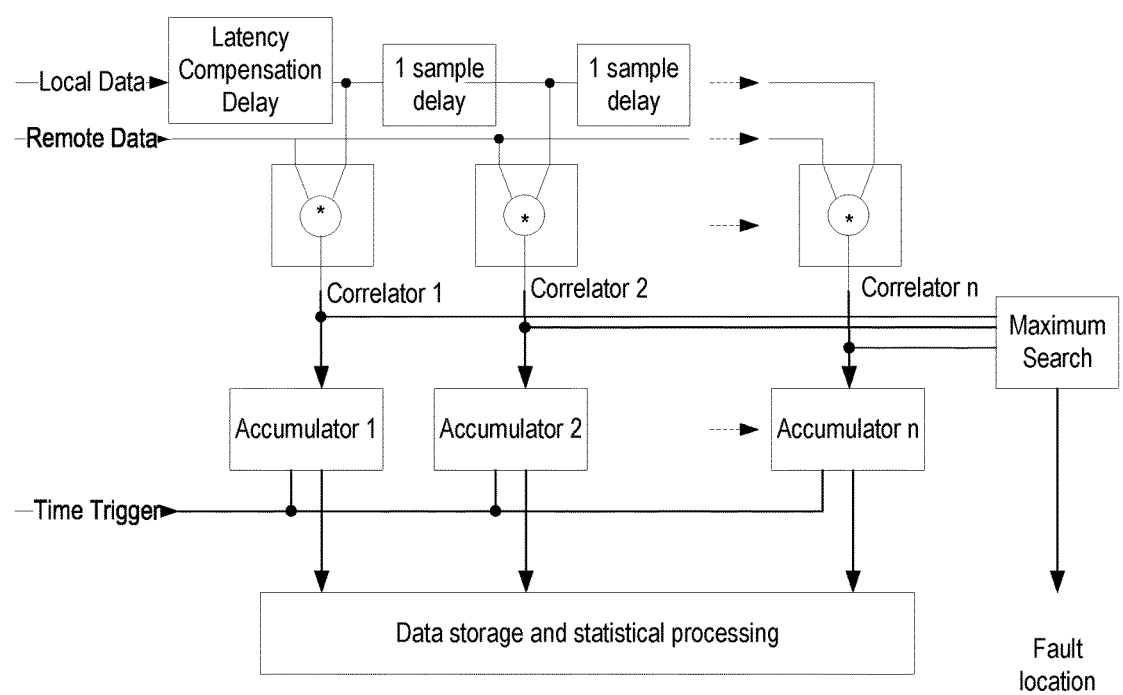
FIG. 13 illustrates a block diagram of a system configured to use of a correlation technique for determining a fault location consistent with certain embodiments of the present disclosure.

FIG. 13 illustrates a block diagram of a system configured to use of a correlation technique for determining a fault location consistent with certain embodiments of the present disclosure. In the embodiment illustrated in FIG. 13, a traveling wave differential module may use multiplication instead of signal addition. This approach is known in the industry as a correlation technique. Operating and restraint quantity is calculated as:

$$i_{OP(t)}=i_{S(t-P)} *i_{R(t)} \qquad \text{Eq. 45}$$

where:

$i_{S(t-P)}$ is the current at local terminal S at the time (t−P) when the traveling wave arrives at the local terminal S, where P is the delay between the traveling wave arrival at the local terminal and the remote terminal, and P≤T, where T is the line propagation delay between the local and remote terminals; and $i_{R(t)}$ is the current at remote Terminal R at the time (t) when the traveling wave arrives at the remote Terminal R. And the restraint current:

$$i_{RT}=|\max(i_{S(t-P)})|+|\max(i_{R(t)})| \qquad \text{Eq. 46}$$

Finally, the traveling wave differential module may declare a fault by comparing the operating and restraint quantities. Equation 47 may be used for such comparison:

$$i_{OP} > k \cdot i_{RT} \qquad \text{Eq. 47}$$

where:

k is a restraining factor.

Correlation calculations can be performed once upon detection of the traveling wave signal or continuously for every input signal sample. Correlator output may further be filtered by averaging a number of output results (samples) with filter length adjusted to encompass single wave peaks as shown in FIGS. 14B, 14C, and 14D. Operation of the correlator described by Eq. 45 may further be modified to search for the time delay P; using P as the unknown variable and performing calculations for all time delays in the range P T (all delays lower than the line propagation delay T).

Correlation technique can also be applied to continuous monitoring of the transmission line health. In this approach transmission line is subdivided into a number of segments with a separate correlator assigned to each segment as shown in FIG. 13. One objective of such an approach is to detect any energy that may be originating from a particular line segment. This energy may include excessive corona discharge, partial insulation breakdown and localized insulator arcing that may be present before the fault and lightning strikes in the immediate vicinity of the line. Line activity is monitored continuously with high frequency energy originating in each segment accumulated over a selectable time period as commanded by the Time Trigger signal (for example 1 second to 24 hours). Accumulated data is subsequently stored for further statistical analysis and alarming purposes.

As illustrated in FIG. 13, individual correlators are fed by two signals. The remotely measured signal (current or voltage for a given phase) obtained through communications and a delayed version of the locally measured signal on the same phase. Each correlator may receive a different delay such that the signals generated on a given segment on the transmission line are lined up to the selected correlator inputs regardless of the fact they are measured on different ends of the transmission line.

Any number of correlators (observed line segments) may be linked to the sampling frequency used to perform measurements at the two ends of the line. For example, with a sampling frequency set to 1 MHz, and the known propagating speed of the traveling wave signals (close to the speed of light c=299.8e6 m/s), the traveling wave will travel 299.8 m (shown as 300 m herein) between two consecutive samples. If the correlator delays are set one sample (1 μs) apart, spatial resolution becomes equal to one half of the travel time 300 m/2=150 m. The number of correlators required to cover the entire line length can be calculated according to:

$$n = 2*L*\frac{fs}{c}$$ Eq. 48 where:
n is the number of correlators.
L is the line length
c is the traveling wave propagating speed which is close to the speed of light
fs is the sampling frequency FIG. 13 also shows a real time "Maximum Search" component preferably running at the correlator rate (i.e. 1 MHz). This component is tasked with finding the highest correlator output in real time, and reporting it as a possible fault location candidate. Since each correlator is associated with a particular segment of the line; highest output associated with the traveling wave arrival directly identifies exact location of the power system fault that caused the traveling wave.

In various embodiments, the sampling frequency may be adjusted (higher or lower than 1 MHz), with the total number of correlators selected to meet the desired spatial resolution. Individual correlators can be assigned to individual transmission line phases (A,B,C) multiplying the total number of correlators required to cover the line by 3.

Figure 14A:
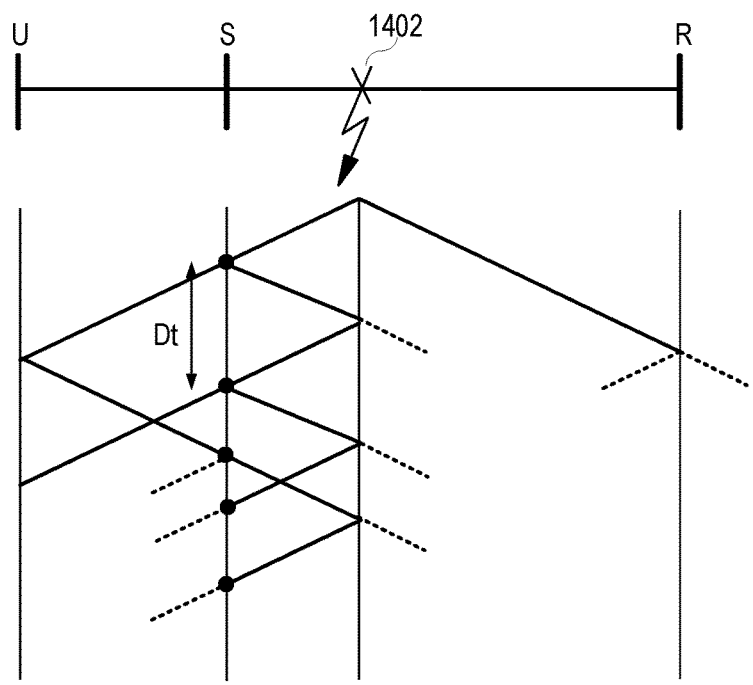
FIG. 14A illustrates TWs launched by a fault and reflected at locations U, S, and R consistent with certain embodiments of the present disclosure.
Figure 14B:
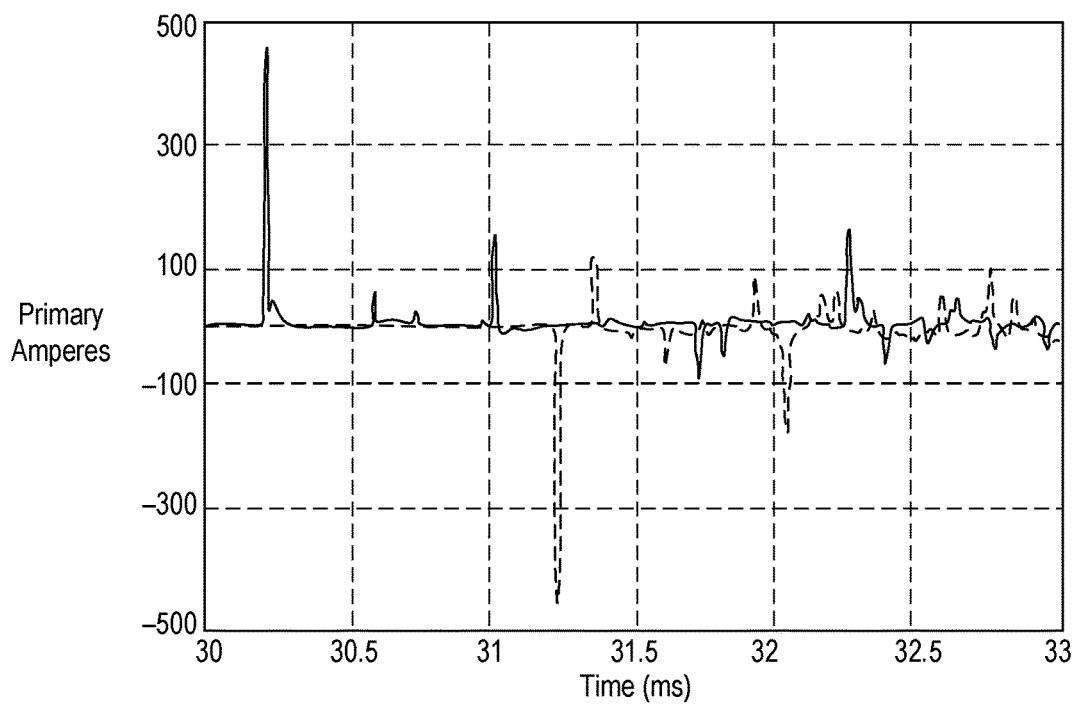
FIG. 14B illustrates a plot over time of traveling wave currents received at Terminal S and Terminal R in FIG. 14A during an external fault consistent with certain embodiments of the present disclosure.
Figure 14C:
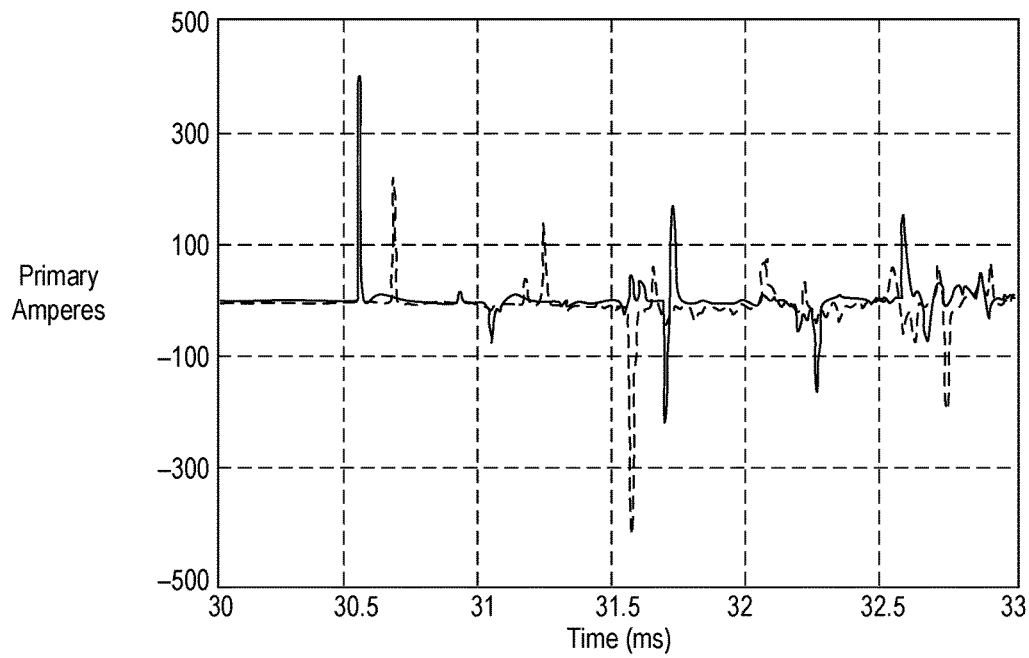
FIG. 14C illustrates a plot over time of traveling wave currents received at Terminal S and Terminal R in FIG. 14A during an external fault consistent with certain embodiments of the present disclosure.
Figure 14D:
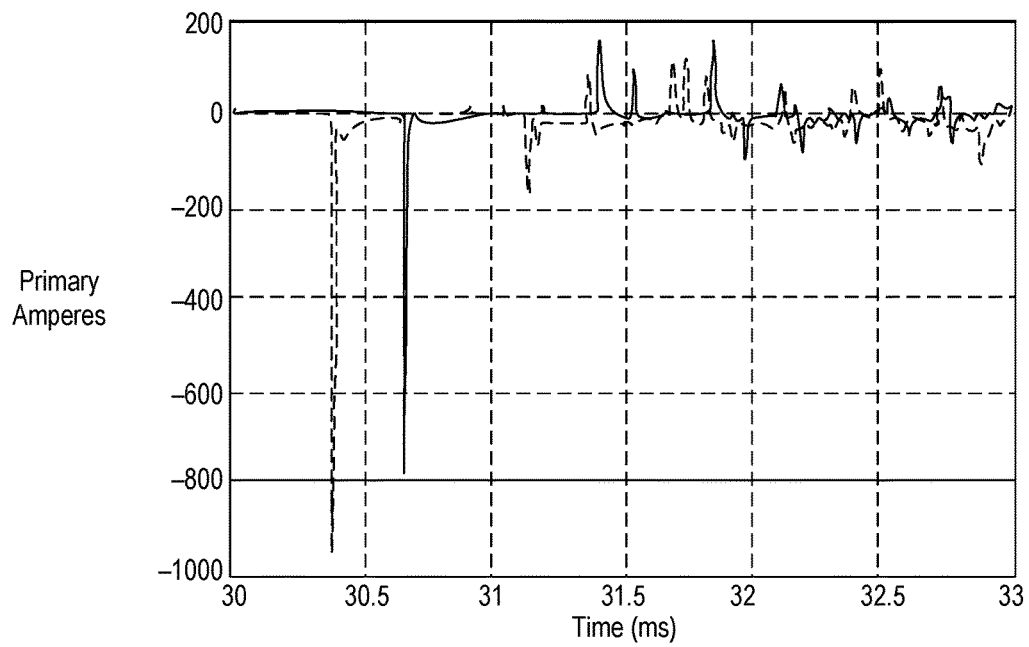
FIG. 14D illustrates a plot of traveling wave currents received at Terminal S and Terminal R in FIG. 14A during an internal fault consistent with certain embodiments of the present disclosure.

FIG. 14A illustrates TWs launched by a fault 1402 and reflected at locations U, S, and R consistent with certain embodiments of the present disclosure. The TW launched by the fault is reflected at the relay location S, is reflected again at the fault point 1402, and returns to location S. An underreaching TW distance element may be designed by measuring the time difference Δt between the arrival of the first TW from the fault and the arrival of the TW reflected at the fault point. The element calculates the fault distance using Δt and the wave propagation velocity and issues a trip if the distance is shorter than the set reach.

In one embodiment, the distance to the fault may be calculated and an appropriate control action may be initiated using the following steps. First, upon arrival of the first TW to the line terminal, a fault detection system determines the fault direction using a directional element, as disclosed herein. For faults in the forward direction, an estimate Δt may be determined between the two TWs, as shown in FIG. 14A. Further, a system may use cross-correlation to verify similarity of the wave reflected from the fault and the prior wave traveling toward the fault. Third, the system may calculate the distance to the fault using Eq. 49.

$$d = \frac{\Delta t}{2} \cdot v$$ Eq. 49

Fourth, if d is less than a reach setting, a control action may be initiated to clear the fault.

FIG. 14B illustrates a plot over time of traveling wave currents received at Terminal S and Terminal R in FIG. 14A during an external fault consistent with certain embodiments of the present disclosure. In each of FIGS. 14B, 14C and 14D, the Terminal S signal (solid line) and Terminal R (dashed line) signal illustrate the B-phase alpha current (B-phase current minus a zero-sequence current). The TWs illustrated in these figures may be obtained using a differentiator-smoother filter having a window length of 20 microseconds. The current TW entered the protected line at the local terminal at 30.20 milliseconds with a value of around +462 A and left the line at the remote terminal at 31.23 milliseconds with a value of around −464 A. The operating signal calculated is approximately 2 A. The restraining signal is approximately 926 A. The restraining signal (926 A) is much greater than the operating signal (2 A), therefore, the element would be restrained and the element restrains as expected.

FIG. 14C illustrates a plot over time of traveling wave currents received at Terminal S and Terminal R in FIG. 14A during an external fault consistent with certain embodiments of the present disclosure. As a result, the first TWs arrived at Terminal S and Terminal R with the same polarity and only around 0.2 milliseconds apart. The operating signal calculated for P=0.2 milliseconds equals around 403 A+219 A=622 A. This case could be mistaken for an internal fault. Notice that the Terminal S TW that entered at around 30.50 milliseconds with an amplitude of 403 A left Terminal R at around 31.53 milliseconds with an amplitude of −411 A. Similarly, the TW that entered Terminal R at around 30.65 milliseconds with an amplitude of 219 A left Terminal S at 31.68 milliseconds with an amplitude of −208 A. Therefore, the restraining signals are 403−(−411)=814 A and 219−(−208)=427 A. The total restraining signal per Equation 40 is 814 A. Because the restraining signal (814 A) is greater than the operating signal (622 A), the element restrains as expected, (using k=1).

FIG. 14D illustrates a plot of traveling wave currents received at Terminal S and Terminal R in FIG. 14A during an internal fault consistent with certain embodiments of the present disclosure. The operating signal for this case is around 960+785=1745 A. The restraining signals are around 960 A and 785 A, respectively, because the initial waves do not leave the line after the line propagation time. The total restraining signal is therefore around 960 A. As a result, the operating signal (1,745 A) is much greater than the restraining signal (960 A), and the element operates dependably.

The signals illustrated in FIGS. 14B-14C may be acquired in some embodiments using a configuration similar to what is illustrated in FIG. 1. Specifically, IEDs 102 and 104 may be in electrical communication with the local 112 and remote 114 terminals of the electric power system, and in communication with each other using communication channel 108. In one embodiment including a traveling wave differential module, communication channel 108 may utilize a high-speed communication channel allowing for exchange of electrical current measurements from each of the IEDs 102, 104 at a rate between about 500,000 and about 5,000,000. In one specific embodiment, the measurements may be exchanged at a rate of around 1 million samples-per-second (1 Msps). Such high-sampling rates may enable a control system to detect and respond to faults more quickly than lower frequency sampling rates.

Figure 15:
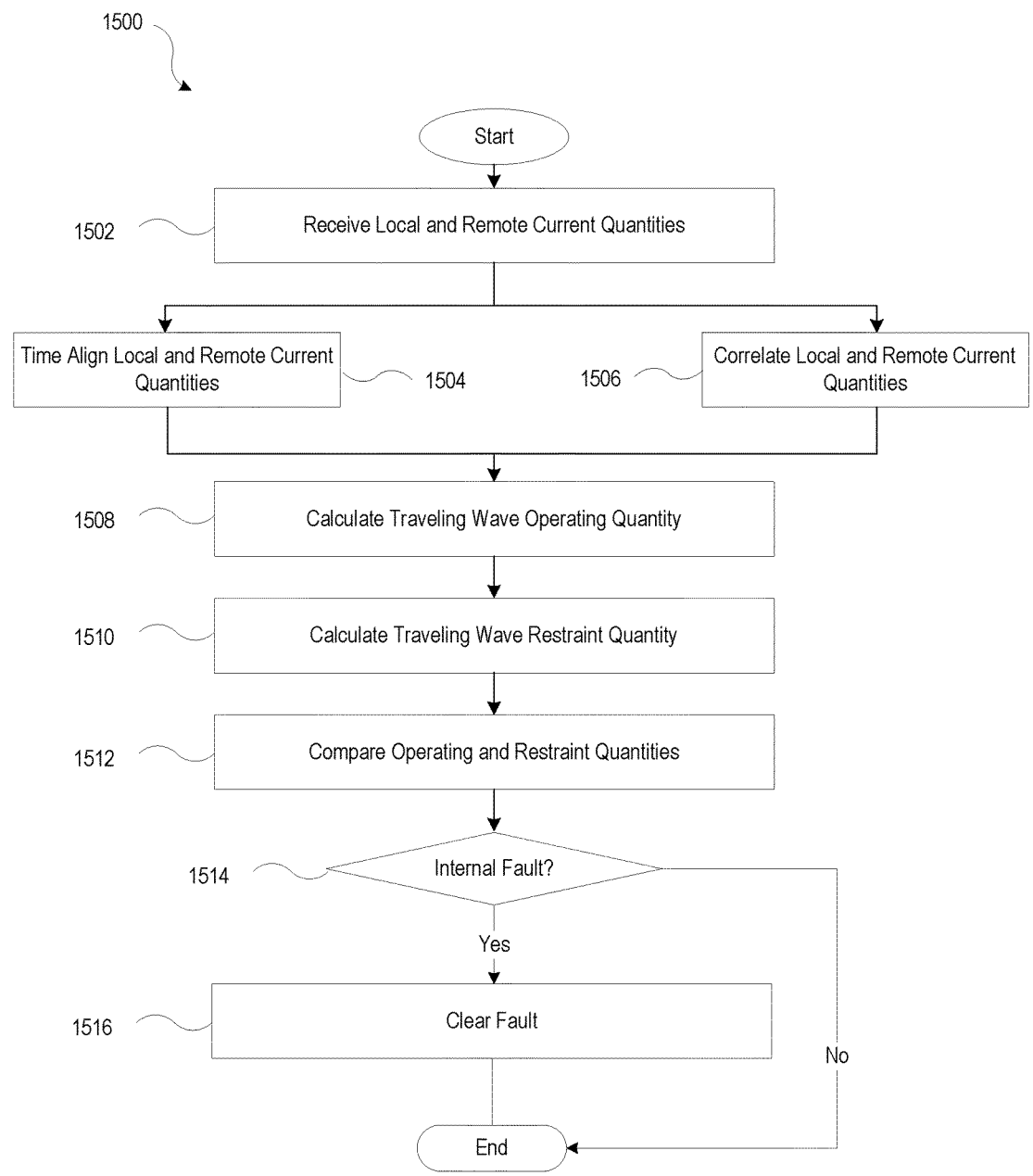
FIG. 15 illustrates a flow diagram of a method for determining internal fault conditions using a traveling wave differential module consistent with certain embodiments of the present disclosure.

FIG. 15 illustrates a flow diagram of a method for determining internal fault conditions using a traveling wave differential module consistent with certain embodiments of the present disclosure. In some embodiments, method 1500 may be implemented using only measurements of electrical currents in an electric power distribution system. Method 1500 starts with receiving local and remote current quantities at 1502. As discussed hereinabove, IEDs may be configured to receive electric power system measurements at two terminals of an electric power delivery system, and to share current quantities at a rate sufficient for detection of traveling waves. In order to accommodate the transitory nature of traveling waves, systems and methods consistent with the present disclosure may be configured to process and/or share information at a rate of approximately 1 million measurements per second. In various embodiments, the method 1500 may either time align the local and remote current quantities at 1504, or correlate local and remote current quantities at 1506. In some embodiments, the method may both time align and correlate local and remote current quantities at 1504 and at 1506. Using the time aligned or correlated current quantities, the method may then calculate a traveling wave operating quantity 1508 using, for example, equations 38-39. Method 1500 may then calculate a traveling wave restraint quantity 1510 using, for example equations 40-43. The method may then compare the operating and restraint quantities at 1512. With the comparison, the method may then determine whether the fault is an internal fault at 1514. If the fault is an internal fault, the fault may be cleared at 1516 through a protection (e.g., opening a circuit breaker). If the fault is not an internal fault, method 1500 may end.

Figure 16:
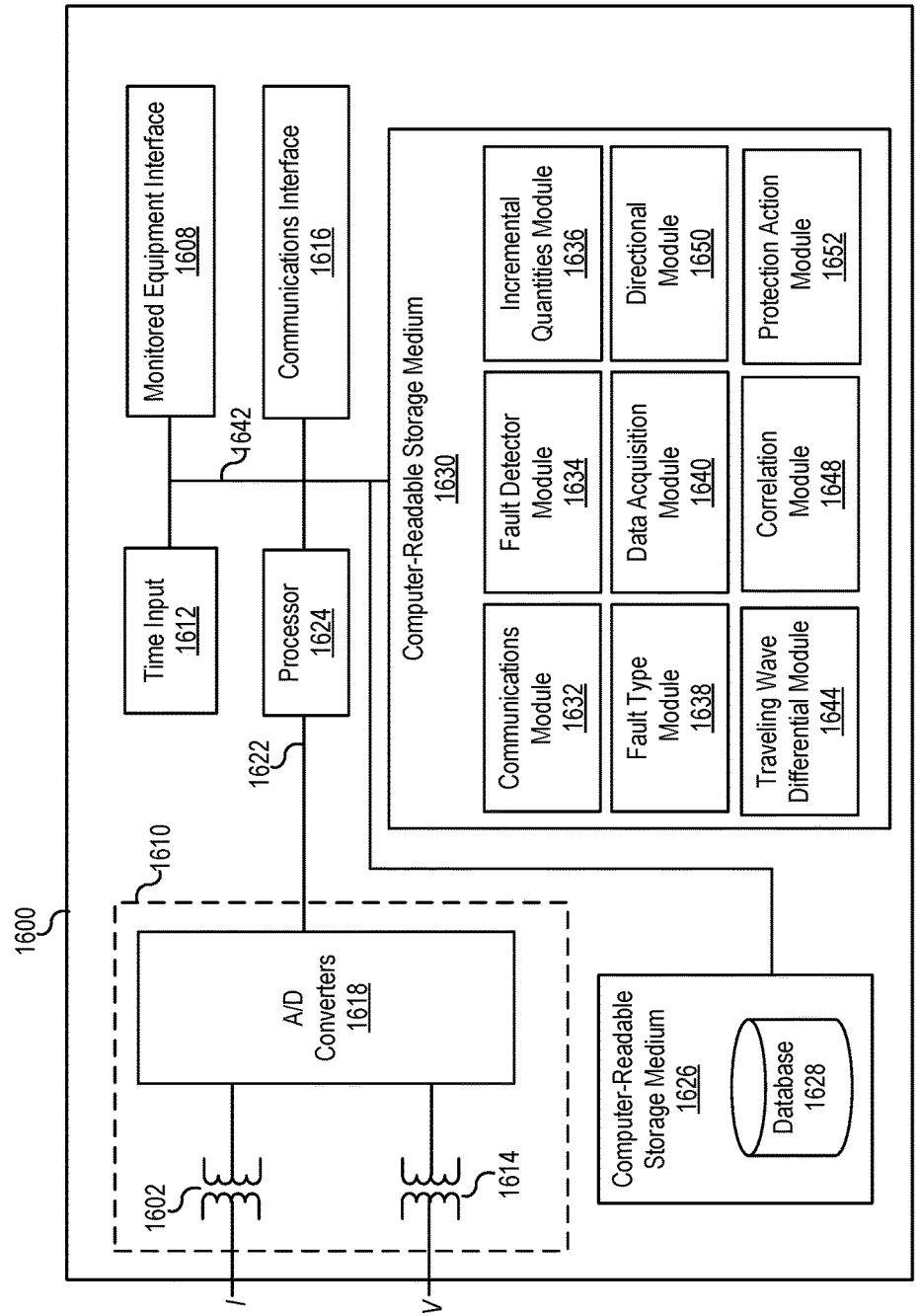
FIG. 16 illustrates a functional block diagram of a system for detecting faults and estimating a fault location using traveling waves consistent with certain embodiments of the present disclosure.

FIG. 16 illustrates a functional block diagram of a system 1600 for detecting and locating faults using time-domain quantities consistent with embodiments of the present disclosure. In certain embodiments, the system 1600 may comprise an IED system configured to, among other things, obtain and calculate time-domain quantities, detect and locate faults using a time-domain distance module, detect and locate faults using a time-domain directional module, and detect and locate faults using traveling waves. System 1600 may be implemented using hardware, software, firmware, and/or any combination thereof. In some embodiments, system 1600 may be embodied as an IED, while in other embodiments, certain components or functions described herein may be associated with other devices or performed by other devices. The specifically illustrated configuration is merely representative of one embodiment consistent with the present disclosure.

System 1600 includes a communications interface 1616 configured to communicate with devices and/or IEDs. In certain embodiments, the communications interface 1616 may facilitate direct communication with other IEDs or communicate with systems over a communications network. Communications interface 1616 may facilitate communications through a network. System 1600 may further include a time input 1612, which may be used to receive a time signal (e.g., a common time reference) allowing system 1600 to apply a time-stamp to the acquired samples. In certain embodiments, a common time reference may be received via communications interface 1616, and accordingly, a separate time input may not be required for time-stamping and/or synchronization operations. One such embodiment may employ the IEEE 1588 protocol. A monitored equipment interface 1608 may be configured to receive status information from, and issue control instructions to, a piece of monitored equipment (such as a circuit breaker, conductor, transformer, or the like).

Processor 1624 may be configured to process communications received via communications interface 1616, time input 1612, and/or monitored equipment interface 1608. Processor 1624 may operate using any number of processing rates and architectures. Processor 1624 may be configured to perform various algorithms and calculations described herein. Processor 1624 may be embodied as a general purpose integrated circuit, an application specific integrated circuit, a field-programmable gate array, and/or any other suitable programmable logic device.

In certain embodiments, system 1600 may include a sensor component 1610. In the illustrated embodiment, sensor component 1610 is configured to gather data directly from conventional electric power system equipment such as a conductor (not shown) using conventional PTs and/or CTs. The sensor component 1610 may use, for example, transformers 1602 and 1614 and A/D converters 1618 that may sample and/or digitize filtered waveforms to form corresponding digitized current and voltage signals provided to data bus 1622. Current (I) and voltage (V) inputs may be secondary inputs from conventional instrument transformers such as, CTs and VTs. A/D converters 1618 may include a single A/D converter or separate A/D converters for each incoming signal. A current signal may include separate current signals from each phase of a three-phase electric power system. A/D converters 1618 may be connected to processor 1624 by way of data bus 1622, through which digitized representations of current and voltage signals may be transmitted to processor 1624. In various embodiments, the digitized current and voltage signals may be used to calculate time-domain quantities for the detection and the location of a fault on an electric power system as described herein.

A computer-readable storage medium 1626 may be the repository of a database 1628 containing electric power line properties for each transmission line and/or each section of each transmission line, such as impedances, resistances, propagation times, reactances, lengths, and/or the like. Another computer-readable storage medium 1630 may be the repository of various software modules configured to perform any of the methods described herein. A data bus 1642 may link monitored equipment interface 1608, time input 1612, communications interface 1616, and computer-readable storage mediums 1626 and 1630 to processor 1624.

Computer-readable storage mediums 1626 and 1630 may be separate mediums, as illustrated in FIG. 16, or may be the same medium (i.e. the same disk, the same non-volatile memory device, or the like). Further, the database 1628 may be stored in a computer-readable storage medium that is not part of the system 1600, but that is accessible to system 1600 using, for example, communications interface 1616.

Communications module 1632 may be configured to allow system 1600 to communicate with any of a variety of external devices via communications interface 1616. Communications module 1632 may be configured for communication using a variety of data communication protocols (e.g., UDP over Ethernet, IEC 61850, etc.).

Data acquisition module 1640 may collect data samples such as the current and voltage quantities and the incremental quantities. The data samples may be associated with a timestamp and made available for retrieval and/or transmission to a remote IED via communications interface 1616. Traveling waves may be measured and recorded in real-time, since they are transient signals that dissipate rapidly in an electric power delivery system. Data acquisition module 1640 may operate in conjunction with fault detector module 1634. Data acquisition module 1640 may control recording of data used by the fault detector module 1634. According to one embodiment, data acquisition module 1640 may selectively store and retrieve data and may make the data available for further processing. Such processing may include processing by fault detector module 1634, which may be configured to determine the occurrence of a fault with an electric power distribution system.

An incremental quantities module 1636 may be configured to calculate time domain incremental quantities based on the techniques disclosed herein. The incremental quantities module 1636 may be configured to use digitized representations of current and/or voltage measurements to calculate incremental quantities therefrom. In some embodiments, system 1600 may be one of a pair of IEDs in communication with different terminals on an electric power system such as the IEDs and system of FIG. 1. In one embodiment, each IED of a pair of IEDs calculates incremental quantities in its own incremental quantities module 1636 for later processing and sharing between the IEDs. In another embodiment, system 1600 may receive digitized representations from both the sensor component 1610 and from a remote IED over a communications channel, and the incremental quantities module 1636 may be configured to calculate incremental signals from both sources to calculate both local and remote incremental quantities.

A fault type module 1638 may be configured to determine a fault type using incremental quantities from module 1636. Fault type module 1638 may use the techniques disclosed herein, including equations from the operating quantities listed in Table 2 to determine a fault type and provide the proper incremental quantities to use for other processing within the IED.

Traveling wave differential module 1644 may determine a control operation to take due to occurrence of a fault by determining a direction to a fault using current quantities only in traveling wave differential calculations. Traveling wave differential module 1644 may use equations 38-44. Traveling wave differential module 1644 may operate according to the method illustrated in FIG. 15.

A correlation module 1648 may be configured to receive local and remote incremental quantities, and to correlate them. The correlation may be done by time alignment using time stamps.

A directional module 1650 may be configured to determine a direction (forward or reverse) to a fault. The directional module 1650 may be configured to use incremental quantities from incremental quantities module 1636 to determine a direction to a fault. The directional module 1650 may use equations 13-21. In various embodiments, directional module 1650 may operate according to FIG. 10. In other embodiments, directional module 1650 may be configured to determine the direction based on the polarity of traveling waves. In such embodiments, the polarities of the voltage and current traveling waves are opposite if the fault is in the forward direction. If the fault is in the reverse direction, the voltage and current traveling waves have same polarity.

A protective action module 1652 may be configured to implement a protective action based on the declaration of a fault by the fault detector module 1634. In various embodiments, a protective action may include tripping a breaker, selectively isolating a portion of the electric power system, etc. In various embodiments, the protective action module 1652 may coordinate protective actions with other devices in communication with system 1600.

In various embodiments system 1600 may be configured to provide protection based on instantaneous voltages and currents. Such signal components require shorter data windows but facilitate faster protection. Various embodiments of system 1600 may be configured to achieve an operating time of approximately 1 millisecond. Such a system may utilize a lumped parameter circuit-based and TW-based time-domain approach and may allow for versatile applications covering various relay input voltage sources and available communications channels. Such a system may utilize high sampling rates MHz), high-resolution (16 bits) synchronized sampling, high-fidelity time synchronization, and a communications network capable of exchanging all acquired data (100 Mbps), or high numeric burden required by some of the algorithms G multiplications per second).

Although several embodiments discussed hereinabove refer to three phases of an alternating-current electric power delivery system, the principles herein may be applied to a multiple-phase alternating-current electric power system having more or less than three phases. For example, a four-phase electric power delivery system is contemplated, as is a six-phase electric power delivery system. The principles taught herein may be applied. In other embodiments, the principles taught may be applied to a direct-current electric power delivery system. In particular, traveling wave detection using currents only in a traveling wave differential module may use current quantities from a direct-current electric power delivery system to detect faults and take control actions thereon.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A system configured to detect a fault in an electric power delivery system, comprising:
 a data acquisition subsystem configured to receive a plurality of representations of electrical conditions associated with at least a portion of the electric power delivery system;
 an incremental quantities subsystem configured to calculate a plurality of incremental current quantities and a plurality of incremental voltage quantities based on the plurality of representations of electrical conditions associated with the at least a portion of the electric power delivery system;
 a fault detection subsystem configured to:
  determine a fault type based on the incremental current quantities and the incremental voltage quantities;
  based on the determined fault type, calculate:
   an applicable current loop quantity using a subset of the plurality of incremental current quantities as:
    $\Delta i_{AZ} - \Delta i_{0Z}$ for A-phase-to-ground fault type;
    $\Delta i_{BZ} - \Delta i_{0Z}$ for B-phase-to-ground fault type;
    $\Delta i_{CZ} - \Delta i_{0Z}$ for C-phase-to-ground fault type;
    $\Delta i_{AZ} - \Delta i_{BZ}$ for A-phase-to-B-phase fault type;
    $\Delta i_{BZ} - \Delta i_{CZ}$ for B-phase-to-C-phase fault type;
    $\Delta i_{CZ} - \Delta i_{AZ}$ for C-phase-to-A-phase fault type; and,
   an applicable voltage loop quantity using a subset of the plurality of incremental voltage quantities as:
    $\Delta v_A$ for A-phase-to-ground fault type;
    $\Delta v_B$ for B-phase-to-ground fault type;
    $\Delta v_C$ for C-phase-to-ground fault type;
    $\Delta v_A - \Delta v_B$ for A-phase-to-B-phase fault type;
    $\Delta v_B - \Delta v_C$ for B-phase-to-C-phase fault type;
    $\Delta v_C - \Delta v_A$ for C-phase-to-A-phase fault type;
  calculate a fault condition using the applicable loop current quantity, and the applicable voltage loop quantity;
  declare a fault condition based on the calculated fault condition; and a protective action subsystem configured to implement a protective action based on the declaration of the fault.

2. The system of claim 1, further comprising a directional subsystem configured to determine a direction to the fault.

3. The system of claim 2, wherein the direction to the fault is determined based on an operating signal determined based on the product of the incremental voltage quantity, and the incremental current quantity.

4. The system of claim 2, further comprising determining an adaptive threshold based on the incremental current quantity and a predetermined setting;
wherein the fault detection subsystem is further configured to declare the fault based on a comparison of the adaptive threshold and an operating signal.

5. The system of claim 4, wherein the adaptive threshold comprises a forward adaptive threshold calculated as the product of a negative predetermined setting and the incremental current quantity squared.

6. The system of claim 2, wherein the direction subsystem is further configured to determine the direction of the fault based on a polarity of an incremental replica current and a time elapsed since the fault.

7. The system of claim 2, wherein the direction subsystem is configured to determine the direction to the fault based on a resistive behavior of the electric power delivery system during a window of time following the fault and to determine the direction to the fault based on a resistive-inductive behavior of the electric power delivery system after the window of time following the fault.

8. The system of claim 1, wherein the plurality of representations of electrical conditions represent time-domain quantities.

9. A method for detecting a fault in an electric power delivery system, comprising:
receiving a plurality of representations of electrical conditions associated with at least a portion of the electric power delivery system;
calculating a plurality of incremental current quantities based on the plurality of representations of electrical conditions associated with the at least a portion of the electric power delivery system;
calculating a plurality of incremental voltage quantities based on the plurality of representations of electrical conditions associated with the at least a portion of the electric power delivery system;
determining a fault type based on the incremental current quantities and the incremental voltage quantities;
based on the determined fault type, calculating:
an applicable current loop quantity using a subset of the plurality of incremental current quantities, as:
$\Delta i_{AZ}$-$\Delta i_{OZ}$ for A-phase-to-ground fault type;
$\Delta i_{BZ}$-$\Delta i_{OZ}$ for B-phase-to-ground fault type;
$\Delta i_{CZ}$-$\Delta i_{OZ}$ for C-phase-to-ground fault type;
$\Delta i_{AZ}$-$\Delta i_{BZ}$ for A-phase-to-B-phase fault type;
$\Delta i_{BZ}$-$\Delta i_{CZ}$ for B-phase-to-C-phase fault type;
$\Delta i_{CZ}$-$\Delta i_{AZ}$ for C-phase-to-A-phase fault type; and,
an applicable voltage loop quantity using a subset of the plurality of incremental voltage quantities, as:
$\Delta v_A$ for A-phase-to-ground fault type;
$\Delta v_B$ for B-phase-to-ground fault type;
$\Delta v_C$ for C-phase-to-ground fault type;
$\Delta v_A$-$\Delta v_B$ for A-phase-to-B-phase fault type;
$\Delta v_B$-$\Delta v_C$ for B-phase-to-C-phase fault type;
$\Delta v_C$-$\Delta v_A$ for C-phase-to-A-phase fault type;
calculating a fault condition using the applicable loop current quantity and the applicable voltage loop quantity;
declaring a fault condition based on the calculated fault condition; and,
implementing a protective action based on the declaration of the fault.

10. The method of claim 9, further comprising determining a direction to the fault.

11. The method of claim 10, wherein determining the direction to the fault comprises determining an operating signal based on the product of the incremental voltage quantity, and the incremental current quantity.

12. The method of claim 11, further comprising determining an adaptive threshold based on the incremental current quantity and a predetermined setting; and
wherein declaring the fault is further based on a comparison of the adaptive threshold and the operating signal.

13. The method of claim 12, further comprising calculating a forward adaptive threshold as the product of a negative predetermined setting and the incremental current quantity squared.

14. The method of claim 13, further comprising calculating a reverse adaptive threshold as the product of a positive predetermined setting and the incremental current quantity squared.

15. The method of claim 14, further comprising declaring a forward fault when the forward adaptive threshold is greater than the operating signal and declaring a reverse fault when the operating signal is greater than the reverse fault threshold.

16. The method of claim 15, further comprising averaging at least one of the operating quantity, the forward fault threshold, and the reverse fault threshold over a data window.

17. The method of claim 10, wherein determining the direction to the fault comprises determining the direction of the fault based on a polarity of an incremental replica current and a time elapsed since the fault.

18. The method of claim 10, further comprising:
determining the direction to the fault based on a resistive behavior of the electric power delivery system during a window of time following the fault; and
determining the direction to the fault based on a resistive-inductive behavior of the electric power delivery system after the window of time following the fault.

19. The method of claim 9, wherein the plurality of representations of electrical conditions represent time-domain quantities.

* * * * *